(12) United States Patent
Lee

(10) Patent No.: US 12,266,298 B2
(45) Date of Patent: Apr. 1, 2025

(54) PIXEL ARRANGEMENT STRUCTURE FOR ORGANIC LIGHT EMITTING DIODE DISPLAY

(71) Applicant: SAMSUNG DISPLAY CO., LTD., Yongin-si (KR)

(72) Inventor: Sang-Shin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/396,582

(22) Filed: Aug. 6, 2021

(65) Prior Publication Data

US 2021/0366376 A1 Nov. 25, 2021

Related U.S. Application Data

(63) Continuation of application No. 17/005,753, filed on Aug. 28, 2020, now Pat. No. 11,626,064, which is a
(Continued)

(30) Foreign Application Priority Data

Mar. 6, 2012 (KR) .................. 10-2012-0022967
Apr. 23, 2013 (KR) .................. 10-2013-0044993

(51) Int. Cl.
G09G 3/3208 (2016.01)
H01L 27/32 (2006.01)
H10K 59/35 (2023.01)

(52) U.S. Cl.
CPC ......... *G09G 3/3208* (2013.01); *H10K 59/352* (2023.02); *H10K 59/353* (2023.02)

(58) Field of Classification Search
CPC ... G09G 3/3208; H10K 59/353; H10K 59/352
See application file for complete search history.

(56) References Cited

U.S. PATENT DOCUMENTS

3,971,065 A 7/1976 Bayer
4,491,863 A 1/1985 Kurahashi
(Continued)

FOREIGN PATENT DOCUMENTS

CN 1726593 A 1/2006
CN 1874000 A 12/2006
(Continued)

OTHER PUBLICATIONS

*Korean Patent Abstracts for Korean Publication 1020070055908 dated May 31, 2007, corresponding to Korean Patent 10-0742370 dated Jul. 24, 2007.
(Continued)

*Primary Examiner* — Kwang-Su Yang
(74) *Attorney, Agent, or Firm* — Lewis Roca Rothgerber Christie LLP

(57) ABSTRACT

A pixel arrangement structure of an organic light emitting diode (OLED) display is provided. The pixel arrangement structure includes: a first pixel having a center coinciding with a center of a virtual square; a second pixel separated from the first pixel and having a center at a first vertex of the virtual square; and a third pixel separated from the first pixel and the second pixel, and having a center at a second vertex neighboring the first vertex of the virtual square. The first pixel, the second pixel, and the third pixel have polygonal shapes.

180 Claims, 6 Drawing Sheets

Related U.S. Application Data continuation of application No. 13/872,018, filed on Apr. 26, 2013, now Pat. No. 10,832,616, which is a continuation-in-part of application No. 13/614,197, filed on Sep. 13, 2012, now Pat. No. 9,818,803.

(56) References Cited

U.S. PATENT DOCUMENTS

| | | |
|---|---|---|
| 4,642,619 A | 2/1987 | Togashi |
| 4,965,565 A | 10/1990 | Noguchi |
| 5,113,274 A | 5/1992 | Takahashi et al. |
| 5,142,392 A | 8/1992 | Ueki et al. |
| 5,461,503 A | 10/1995 | Deffontaines et al. |
| 5,485,293 A | 1/1996 | Robinder |
| 5,742,129 A | 4/1998 | Nagayama et al. |
| 6,078,371 A | 6/2000 | Ichikawa et al. |
| 6,198,507 B1 | 3/2001 | Ishigami |
| 6,326,981 B1 | 12/2001 | Mori et al. |
| 6,366,025 B1 | 4/2002 | Yamada |
| 6,552,706 B1 | 4/2003 | Ikeda et al. |
| 6,747,618 B2 | 6/2004 | Arnold et al. |
| 6,838,819 B2 | 1/2005 | Kim et al. |
| 6,867,549 B2 | 3/2005 | Cok et al. |
| 6,882,364 B1 | 4/2005 | Inuiya et al. |
| 6,897,855 B1 | 5/2005 | Matthies et al. |
| 6,933,976 B1 | 8/2005 | Suzuki |
| 6,950,115 B2 | 9/2005 | Brown Elliott |
| 7,075,242 B2 | 7/2006 | Miller et al. |
| 7,091,986 B2 | 8/2006 | Phan |
| 7,110,031 B2 | 9/2006 | Kondo et al. |
| 7,126,272 B2 | 10/2006 | Matsumoto |
| 7,184,067 B2 | 2/2007 | Miller et al. |
| 7,187,425 B2 | 3/2007 | Yamazaki |
| 7,215,347 B2 | 5/2007 | Phan |
| 7,230,594 B2 | 6/2007 | Miller et al. |
| 7,250,722 B2 | 7/2007 | Cok et al. |
| 7,274,383 B1 | 9/2007 | Brown Elliot |
| 7,291,970 B2 | 11/2007 | Kuwabara |
| 7,301,273 B2 | 11/2007 | Dedene et al. |
| 7,397,485 B2 | 7/2008 | Miller et al. |
| 7,515,122 B2 | 4/2009 | Miller et al. |
| 7,612,811 B2 | 11/2009 | Takeuchi et al. |
| 7,646,430 B2 | 1/2010 | Brown Elliot et al. |
| 7,710,484 B2 | 5/2010 | Oda |
| 7,755,652 B2 | 7/2010 | Credelle et al. |
| 7,982,786 B2 | 7/2011 | Nishida et al. |
| 7,986,089 B2 | 7/2011 | Kitabayashi |
| 8,026,669 B2 | 9/2011 | Kawasaki et al. |
| 8,026,869 B2 | 9/2011 | Takagi et al. |
| 8,118,633 B2 | 2/2012 | Yuasa |
| 8,134,583 B2 | 3/2012 | Credelle |
| 8,159,511 B2 | 4/2012 | Brown Elliott et al. |
| 8,223,168 B2 | 7/2012 | Brown Elliott et al. |
| 8,294,741 B2 | 10/2012 | Brown Elliot et al. |
| 8,330,152 B2 | 12/2012 | So |
| 8,330,352 B2 | 12/2012 | Sung et al. |
| 8,334,859 B2 | 12/2012 | Liu et al. |
| 8,350,468 B2 | 1/2013 | Ko et al. |
| 8,354,789 B2 | 1/2013 | Kim et al. |
| 8,363,072 B2 | 1/2013 | Hong et al. |
| 8,395,157 B2 | 3/2013 | Park et al. |
| 8,395,571 B2 | 3/2013 | Kim et al. |
| 8,405,692 B2 | 3/2013 | Brown Elliott et al. |
| 8,421,820 B2 | 4/2013 | Brown Elliott et al. |
| 8,456,496 B2 | 6/2013 | Credelle |
| 8,519,910 B2 | 8/2013 | Park et al. |
| 8,519,917 B2 | 8/2013 | Ryu et al. |
| 8,552,635 B2 | 10/2013 | Kim et al. |
| 8,558,222 B2 | 10/2013 | Hwang et al. |
| 8,587,003 B2 | 11/2013 | Ando |
| 8,754,913 B2 | 6/2014 | Hwang et al. |
| 8,830,275 B2 | 9/2014 | Higgins |
| 8,833,294 B2 | 9/2014 | Lee et al. |
| 8,853,016 B2 | 10/2014 | Park et al. |
| 8,866,707 B2 | 10/2014 | Koyama et al. |
| 8,883,532 B2 | 11/2014 | Ando |
| 8,934,034 B2 | 1/2015 | Nayar et al. |
| 9,041,625 B2 | 5/2015 | Hwang et al. |
| 9,305,487 B2 | 4/2016 | Yang et al. |
| 9,355,601 B2 | 5/2016 | Brown Elliott |
| 9,398,205 B2 | 7/2016 | Cote et al. |
| 9,431,469 B2 | 8/2016 | Park et al. |
| 9,837,476 B2 | 12/2017 | Park et al. |
| 10,403,211 B2 | 9/2019 | Hai et al. |
| 10,854,683 B2 | 12/2020 | Lee |
| 2002/0015110 A1 | 2/2002 | Brown Elliott |
| 2002/0070909 A1 | 6/2002 | Asano et al. |
| 2002/0113195 A1 | 8/2002 | Osada |
| 2002/0140833 A1 | 10/2002 | Hirai |
| 2003/0076454 A1 | 4/2003 | Burroughes |
| 2003/0117423 A1 | 6/2003 | Brown Elliott et al. |
| 2003/0128179 A1 | 7/2003 | Credelle |
| 2003/0128225 A1 | 7/2003 | Credelle et al. |
| 2003/0218618 A1 | 11/2003 | Phan |
| 2004/0036421 A1 | 2/2004 | Arnold et al. |
| 2004/0046714 A1 | 3/2004 | Brown Elliott |
| 2004/0108818 A1 | 6/2004 | Cok et al. |
| 2004/0113875 A1 | 6/2004 | Miller et al. |
| 2004/0150651 A1 | 8/2004 | Phan |
| 2004/0183764 A1 | 9/2004 | Kim et al. |
| 2004/0246426 A1 | 12/2004 | Wang et al. |
| 2005/0001542 A1 | 1/2005 | Kiguchi |
| 2005/0116615 A1 | 6/2005 | Matsumoto et al. |
| 2005/0162079 A1 | 7/2005 | Sakamoto |
| 2005/0225575 A1 | 10/2005 | Elliott et al. |
| 2005/0270444 A1 | 12/2005 | Miller et al. |
| 2006/0119738 A1 | 6/2006 | Kido |
| 2006/0152531 A1 | 7/2006 | Lin et al. |
| 2006/0274090 A1 | 12/2006 | Koyama et al. |
| 2007/0164335 A1 | 7/2007 | McKee |
| 2007/0230818 A1 | 10/2007 | Messing et al. |
| 2008/0001525 A1 | 1/2008 | Chao et al. |
| 2008/0001527 A1 | 1/2008 | Koo et al. |
| 2008/0018765 A1 | 1/2008 | Choi et al. |
| 2008/0231554 A1 | 9/2008 | Lee |
| 2008/0273793 A1 | 11/2008 | Oishi |
| 2008/0308819 A1 | 12/2008 | Louwsma et al. |
| 2009/0027377 A1 | 1/2009 | Kwon |
| 2009/0194780 A1 | 8/2009 | Kwon |
| 2009/0244101 A1 | 10/2009 | Langendijk et al. |
| 2009/0302331 A1 | 12/2009 | Smith et al. |
| 2009/0321727 A1 | 12/2009 | Yutani et al. |
| 2010/0033084 A1 | 2/2010 | Ko et al. |
| 2010/0045695 A1 | 2/2010 | Brown Elliot et al. |
| 2010/0117528 A1 | 5/2010 | Fukuda |
| 2010/0117936 A1 | 5/2010 | Lhee et al. |
| 2010/0133994 A1 | 6/2010 | Song et al. |
| 2010/0171440 A1 | 7/2010 | Satou et al. |
| 2010/0253608 A1 | 10/2010 | Kim et al. |
| 2010/0315318 A1 | 12/2010 | Lee et al. |
| 2011/0012820 A1 | 1/2011 | Kim et al. |
| 2011/0018858 A1 | 1/2011 | Ryu et al. |
| 2011/0084955 A1 | 4/2011 | Kim |
| 2011/0115772 A1 | 5/2011 | Chung |
| 2011/0147770 A1 | 6/2011 | Hwang et al. |
| 2011/0177640 A1 | 7/2011 | Han et al. |
| 2011/0211099 A1 | 9/2011 | Nayar et al. |
| 2011/0215302 A1 | 9/2011 | Lhee et al. |
| 2011/0216056 A1 | 9/2011 | Yoo et al. |
| 2011/0260951 A1 | 10/2011 | Hwang et al. |
| 2011/0291549 A1 | 12/2011 | Kim et al. |
| 2011/0291550 A1 | 12/2011 | Kim et al. |
| 2011/0298836 A1 | 12/2011 | Komiya et al. |
| 2011/0316892 A1 | 12/2011 | Sung et al. |
| 2012/0028390 A1 | 2/2012 | Lee et al. |
| 2012/0049726 A1 | 3/2012 | Yoo et al. |
| 2012/0056531 A1 | 3/2012 | Park et al. |
| 2012/0086330 A1 | 4/2012 | Umeda et al. |
| 2012/0092238 A1 | 4/2012 | Hwang et al. |
| 2012/0176298 A1 | 7/2012 | Suh et al. |
| 2012/0287605 A1 | 11/2012 | Chen et al. |
| 2012/0313844 A1 | 12/2012 | Im et al. |
| 2012/0319564 A1 | 12/2012 | Ghosh et al. |
| 2013/0002911 A1 | 1/2013 | Miyashita et al. |

(56) References Cited

U.S. PATENT DOCUMENTS

| | | |
|---|---|---|
| 2013/0037827 A1 | 2/2013 | Levermore et al. |
| 2013/0057521 A1 | 3/2013 | Kim |
| 2013/0106891 A1 | 5/2013 | Matsueda et al. |
| 2013/0127689 A1 | 5/2013 | Gollier |
| 2014/0191202 A1 | 7/2014 | Shim et al. |
| 2015/0070562 A1 | 3/2015 | Nayar et al. |
| 2015/0187273 A1 | 7/2015 | Chang et al. |
| 2015/0192834 A1 | 7/2015 | Morinaga et al. |
| 2016/0124557 A1 | 5/2016 | Choi |
| 2016/0171930 A1 | 6/2016 | Song et al. |
| 2016/0190166 A1 | 6/2016 | Kim et al. |
| 2019/0333970 A1 | 10/2019 | Lee |
| 2020/0394955 A1 | 12/2020 | Lee |
| 2022/0319406 A1 | 10/2022 | Lee |
| 2023/0245620 A1 | 8/2023 | Lee |

FOREIGN PATENT DOCUMENTS

| | | |
|---|---|---|
| CN | 1889271 A | 1/2007 |
| CN | 101009304 A | 8/2007 |
| CN | 101211518 A | 7/2008 |
| CN | 100439989 C | 12/2008 |
| CN | 100448020 C | 12/2008 |
| CN | 101449382 A | 6/2009 |
| CN | 102054435 A | 5/2011 |
| CN | 102354479 A | 2/2012 |
| CN | 103311266 A | 9/2013 |
| CN | 203260586 U | 10/2013 |
| CN | 105206647 A | 12/2015 |
| EP | 0 322 106 A2 | 6/1989 |
| EP | 1168448 A2 | 1/2002 |
| EP | 1450408 A2 | 8/2004 |
| EP | 2 637 209 A1 | 9/2013 |
| GB | 2 437 110 A | 10/2007 |
| JP | H01-181074 U | 12/1989 |
| JP | 02-000826 A | 1/1990 |
| JP | 03-078390 A | 4/1991 |
| JP | 3-36239 | 5/1991 |
| JP | 8-227276 A | 9/1996 |
| JP | 08-335060 A | 12/1996 |
| JP | 09-182091 A | 7/1997 |
| JP | 10-39791 | 2/1998 |
| JP | 2000-180837 A | 6/2000 |
| JP | 2000-235891 | 8/2000 |
| JP | 2001-33757 A | 2/2001 |
| JP | 2001-54127 A | 2/2001 |
| JP | 2001-76881 A | 3/2001 |
| JP | 3203907 B2 | 9/2001 |
| JP | 2001-290441 A | 10/2001 |
| JP | 2003-203770 A | 7/2003 |
| JP | 2004-507773 | 3/2004 |
| JP | 2004-117431 A | 4/2004 |
| JP | 2004-179028 A | 6/2004 |
| JP | 2004-192813 | 7/2004 |
| JP | 2005-5227 A | 1/2005 |
| JP | 2005-62416 A | 3/2005 |
| JP | 2005-63787 A | 3/2005 |
| JP | 2005-515505 A | 5/2005 |
| JP | 2005-352140 A | 12/2005 |
| JP | 4496852 B2 | 12/2005 |
| JP | 2006-18195 A | 1/2006 |
| JP | 2006-163316 A | 6/2006 |
| JP | 2006-309182 | 11/2006 |
| JP | 2007-156126 A | 6/2007 |
| JP | 2008-015521 | 1/2008 |
| JP | 2008-502004 A | 1/2008 |
| JP | 2008-277264 A | 11/2008 |
| JP | 2008-298966 A | 12/2008 |
| JP | 2008-300367 A | 12/2008 |
| JP | 2009-48851 A | 3/2009 |
| JP | 4278353 B2 | 6/2009 |
| JP | 2009-182320 A | 8/2009 |
| JP | 2009-230096 A | 10/2009 |
| JP | 2009-250994 A | 10/2009 |
| JP | 2010-3880 A | 1/2010 |
| JP | 2010-153173 A | 7/2010 |
| JP | 2011-076760 | 4/2011 |
| JP | 2011-198761 A | 10/2011 |
| JP | 2011-528866 A | 11/2011 |
| JP | 2012-15129 A | 1/2012 |
| JP | 2012-19206 A | 1/2012 |
| JP | 2012-028170 A | 2/2012 |
| JP | 2012-79631 A | 4/2012 |
| JP | 5177957 B2 | 4/2013 |
| JP | 2022-046648 A | 3/2022 |
| KR | 10-2004-0096706 A | 11/2004 |
| KR | 10-2006-0118868 A | 11/2006 |
| KR | 10-0742370 B1 | 7/2007 |
| KR | 10-0807524 B1 | 2/2008 |
| KR | 10-2008-0020320 A | 3/2008 |
| KR | 10-2008-0111130 | 12/2008 |
| KR | 10-2009-0017910 A | 2/2009 |
| KR | 10-2009-0049515 A | 5/2009 |
| KR | 10-1015332 B1 | 2/2011 |
| KR | 10-2011-0023996 A | 3/2011 |
| KR | 10-2011-0030954 A | 3/2011 |
| KR | 10-2011-0039773 A | 4/2011 |
| KR | 10-2011-0071446 A | 6/2011 |
| KR | 10-1056258 B1 | 8/2011 |
| KR | 10-2011-0106565 A | 9/2011 |
| KR | 10-2011-0108049 A | 10/2011 |
| KR | 10-2011-0108050 A | 10/2011 |
| KR | 10-2011-0117613 A | 10/2011 |
| KR | 10-2011-0129531 | 12/2011 |
| KR | 10-2012-0000887 A | 1/2012 |
| KR | 10-2012-0012300 A | 2/2012 |
| KR | 10-2012-0014074 A | 2/2012 |
| KR | 10-2012-0022967 A | 3/2012 |
| KR | 10-1332495 B1 | 11/2013 |
| KR | 10-2020-0000840 A | 1/2020 |
| KR | 10-2585302 B1 | 10/2023 |
| TW | 200305126 A | 10/2003 |
| TW | I277930 B | 4/2007 |
| TW | I328207 | 8/2010 |
| WO | WO 03/053068 A2 | 6/2003 |
| WO | WO 03/060870 A1 | 7/2003 |
| WO | WO 2004/073356 A1 | 8/2004 |
| WO | WO 2005/067352 A1 | 7/2005 |

OTHER PUBLICATIONS

English Abstract of TW 2008-02221 A, also published as TW I328207.
EPO Communication Pursuant to Article 94(3) EPC, for Patent Application No. 13 178 648.5, dated Jan. 31, 2019, 8 pages.
EPO Search Report dated Jul. 8, 2013, for corresponding European Patent application 13157562.3, (6 pages).
EPO Search Report dated Jul. 9, 2014, for European Patent application 14155124.2, (8 pages).
Extended European Search Report dated Dec. 20, 2013, for corresponding European Patent Application No. 13178648.5 (9 pages).
JPO Office action dated Feb. 16, 2016, corresponding to Japanese Patent application 2012-108855, (5 pages).
KIPO Office action dated Jul. 11, 2016, with English translation, for corresponding Korean Patent application 10-2016-0047800, (11 pages).
Korean Patent Abstracts of Korean Publication No. 10-2003-0031207 A, published Apr. 21, 2003, which corresponds to KR 10-0807524 B1, 2 pages.
SIPO Office action dated Mar. 11, 2015, corresponding to Chinese Patent application 201310035429.X, (7 pages).
Taiwan Office action dated Mar. 30, 2015, corresponding to Taiwanese Patent application 102101000, (7 pages).
TIPO Office Action dated Oct. 11, 2016, for corresponding Taiwanese Patent Application No. 102124953 (6 pages).
U.S. Final Office Action dated Feb. 1, 2021, issued in U.S. Appl. No. 16/505,536 (8 pages).
U.S. Office Action dated Apr. 30, 2020, issued in U.S. Appl. No. 16/505,536 (14 pages).
U.S. Office action dated Apr. 7, 2016, for U.S. Appl. No. 13/614,197, (13 pages).

(56) References Cited

OTHER PUBLICATIONS

U.S. Office action dated Aug. 29, 2014, for cross reference U.S. Appl. No. 14/059,356, (18 pages).
U.S. Office action dated Dec. 2, 2015, for cross reference U.S. Appl. No. 13/614,197, (12 pages).
U.S. Office Action dated Jul. 11, 2018, issued in U.S. Appl. No. 15/811,599 (19 pages).
U.S. Office action dated Jul. 15, 2015, for cross reference U.S. Appl. No. 13/614,197, (11 pages).
U.S. Office action dated Mar. 12, 2015, for cross reference U.S. Appl. No. 13/614,197, (13 pages).
U.S. Office Action dated Mar. 19, 2018, issued in U.S. Appl. No. 15/688,760 (13 pages).
U.S. Office Action dated May 25, 2021, issued in U.S. Appl. No. 16/505,536 (15 pages).
U.S. Office action dated Nov. 7, 2014, for cross reference U.S. Appl. No. 13/614,197, (16 pages).
U.S. Office Action dated Oct. 14, 2016 issued in cross-reference U.S. Appl. No. 13/614,197 (12 pages).
U.S. Office Action dated Oct. 21, 2020, issued in U.S. Appl. No. 16/882,384 (24 pages).
U.S. Office Action dated Oct. 25, 2019, issued in U.S. Appl. No. 16/505,536 (14 pages).
U.S. Office Action dated Sep. 3, 2019, issued in U.S. Appl. No. 16/261,437 (11 pages).
U.S. Office action issued in U.S. Appl. No. 15/811,599 by the USPTO, dated Jul. 19, 2019, 19 pages.
U.S. Office action issued in U.S. Appl. No. 17/005,753 by the USPTO, dated Apr. 13, 2021, 22 pages.
U.S Notice of Allowance dated Dec. 23, 2022, issued in U.S. Appl. No. 16/505,536 (9 pages).
U.S. Final Office Action dated Jan. 4, 2023, issued in U.S. Appl. No. 17/808,985 (27 pages).
U.S. Advisory Action from U.S. Appl. No. 13/614,197, dated Feb. 5, 2016, 3 pages.
U.S. Notice of Allowance from U.S. Appl. No. 14/059,356, dated Sep. 10, 2015, 5 pages.
U.S. Restriction Requirement from U.S. Appl. No. 13/614,197, dated Aug. 18, 2014, 7 pages.
U.S. Restriction Requirement from U.S. Appl. No. 16/505,536 dated Aug. 5, 2019, 7 pages.
U.S. Office Action dated Sep. 19, 2022, issued in U.S. Appl. No. 17/808,985 (25 pages).
U.S. Office Action dated Oct. 14, 2022, issued in U.S. Appl. No. 17/808,982 (25 pages).
U.S. Office Action dated Oct. 14, 2022, issued in U.S. Appl. No. 17/808,983 (23 pages).
U.S. Office Action dated Nov. 3, 2022, issued in U.S. Appl. No. 17/808,984 (25 pages).
U.S. Office Action dated Nov. 10, 2022, issued in U.S. Appl. No. 17/865,304 (23 pages).
Chinese Office Action dated Sep. 13, 2022, issued in Chinese Patent Application No. 201910040602.2 (9 pages).
U.S. Office Action dated Jul. 8, 2022, issued in U.S. Appl. No. 17/005,753 (48 pages).
Decision by the Intellectual Property Trial and Appeal Board (IPTAB) of the Korean Intellectual Property Office (KIPO) on Patent Cancellation Request of Korean Patent No. KR 2115531 (corresponding to U.S. Pat. No. 9,818,803) dated Mar. 16, 2021, 12 pages.
English translation of Decision by the Intellectual Property Trial and Appeal Board (IPTAB) of the Korean Intellectual Property Office (KIPO) on Patent Cancellation Request of Korean Patent No. KR 2115531 (corresponding to U.S. Pat. No. 9,818,803) dated Mar. 16, 2021, 15 pages.
English translation of Petition for Patent Invalidation of Chinese Patent No. ZL201310035429.X (corresponding to U.S. Pat. No. 9,818,803) dated Dec. 22, 2020, 31 pages.
English translation of Petition for Patent Invalidation of Chinese Patent No. ZL201510595095.0 (corresponding to U.S. Pat. No. 9,818,803) dated Jan. 22, 2021, 26 pages.
U.S. Final Office Action dated Nov. 24, 2021, issued in U.S. Appl. No. 16/505,536 (20 pages).
U.S. Final Office Action dated Nov. 24, 2021, issued in U.S. Appl. No. 17/005,753 (13 pages).
Advisory Action for U.S. Appl. No. 13/614,197 dated May 18, 2015, 3 pages.
Advisory Action for U.S. Appl. No. 13/872,018 dated Nov. 14, 2016, 3 pages.
Advisory Action for U.S. Appl. No. 13/872,018 dated Dec. 8, 2015, 3 pages.
Advisory Action for U.S. Appl. No. 16/505,536 dated Apr. 7, 2021, 3 pages.
Ex Parte Quayle Action for U.S. Appl. No. 13/614,197 dated Jan. 5, 2017, 5 pages.
Ex Parte Quayle Action for U.S. Appl. No. 15/090,591 dated Aug. 5, 2016, 6 pages.
Final Office Action for U.S. Appl. No. 13/614,197 dated Dec. 2, 2015, 11 pages.
Final Office Action for U.S. Appl. No. 13/872,018 dated May 11, 2017, 16 pages.
Final Office Action for U.S. Appl. No. 13/872,018 dated Jun. 23, 2016, 12 pages.
Final Office Action for U.S. Appl. No. 13/872,018 dated Oct. 16, 2015, 15 pages.
Final Office Action for U.S. Appl. No. 14/059,356 dated Jun. 18, 2015, 15 pages.
Final Office Action for U.S. Appl. No. 15/811,599 dated Jan. 21, 2020, 18 pages.
Final Office Action for U.S. Appl. No. 16/505,536 dated Oct. 27, 2020, 15 pages.
Notice of Allowance for U.S. Appl. No. 13/614,197 dated Mar. 22, 2017, 7 pages.
Notice of Allowance for U.S. Appl. No. 13/614,197 dated Jul. 11, 2017, 7 pages.
Notice of Allowance for U.S. Appl. No. 13/872,018 dated Feb. 19, 2020, 5 pages.
Notice of Allowance for U.S. Appl. No. 13/872,018 dated May 28, 2020, 5 pages.
Notice of Allowance for U.S. Appl. No. 14/059,356 dated Apr. 27, 2016, 5 pages.
Notice of Allowance for U.S. Appl. No. 14/059,356 dated Nov. 25, 2015, 5 pages.
Notice of Allowance for U.S. Appl. No. 15/090,591 dated Feb. 13, 2017, 5 pages.
Notice of Allowance for U.S. Appl. No. 15/090,591 dated Jul. 31, 2017, 5 pages.
Notice of Allowance for U.S. Appl. No. 15/090,591 dated Dec. 9, 2016, 5 pages.
Notice of Allowance for U.S. Appl. No. 15/688,760 dated Jan. 30, 2019, 5 pages.
Notice of Allowance for U.S. Appl. No. 15/688,760 dated Sep. 14, 2018, 5 pages.
Notice of Allowance for U.S. Appl. No. 15/811,599 dated Feb. 14, 2019, 7 pages.
Notice of Allowance for U.S. Appl. No. 15/811,599 dated Mar. 31, 2020, 5 pages.
Notice of Allowance for U.S. Appl. No. 15/811,599 dated Jul. 10, 2020, 5 pages.
Notice of Allowance for U.S. Appl. No. 16/261,437 dated Jan. 10, 2020, 6 pages.
Notice of Allowance for U.S. Appl. No. 16/261,437 dated Apr. 27, 2020, 5 pages.
Notice of Allowance for U.S. Appl. No. 16/261,437 dated Aug. 14, 2020, 5 pages.
Notice of Allowance for U.S. Appl. No. 16/261,437 dated Dec. 28, 2020, 5 pages.
Office Action for U.S. Appl. No. 13/872,018 dated Feb. 29, 2016, 14 pages.
Office Action for U.S. Appl. No. 13/872,018 dated Jun. 30, 2015, 13 pages.

(56) References Cited

OTHER PUBLICATIONS

Office Action for U.S. Appl. No. 13/872,018 dated Dec. 30, 2016, 14 pages.
Office Action for U.S. Appl. No. 16/505,536 dated May 11, 2022, 53 pages.
Patent Board Decision on Appeal for U.S. Appl. No. 13/872,018 dated Dec. 2, 2019, 8 pages.
Restriction Requirement for U.S. Appl. No. 13/872,018 dated Nov. 5, 2014, 8 pages.
Restriction Requirement for U.S. Appl. No. 15/811,599 dated Mar. 28, 2018, 7 pages.
Patent Owner's Preliminary Response to Petition for Inter Partes Review for U.S. Pat. No. 10,854,683, Case No. IPR 2023-00988, dated Oct. 16, 2023 (72 pages).
Patent Owner's Preliminary Response to Petition for Inter Partes Review for U.S. Pat. No. 11,594,578, Case No. IPR 2023-01075, dated Oct. 12, 2023 (69 pages).
Patent Owner's Preliminary Response to Petition for Inter Partes Review for U.S. Pat. No. 9,818,803, Case No. IPR 2023-00987, dated Oct. 10, 2023 (73 pages).
Decision Granting Institution of Inter Partes Review Case No. IPR2023-01075 of U.S. Pat. No. 11,594,578 B2, dated Jan. 8, 2024, 49 pages.
Decision Granting Institution of Inter Partes Review Case No. IPR2023-00988 of U.S. Pat. No. 10,854,683 B2, dated Jan. 8, 2024, 49 pages.
Decision Granting Institution of Inter Partes Review Case No. IPR2023-00987 of U.S. Pat. No. 9,818,803 B2, dated Jan. 8, 2024, 54 pages.
Excerpt from Complainant's Opening Claim Construction Brief before the United States International Trade Commission, ITC Investigation No. 337-TA-1351, dated Jun. 13, 2023 (12 pages).
Petition for Inter Partes Review for U.S. Pat. No. 9,818,803, Case No. IPR 2023-00987, dated Jun. 21, 2023 (90 pages).
Declaration of P. Morgan Pattison, Exhibit 1003 in Petition for Inter Partes Review for U.S. Pat. No. 9,818,803, Case No. IPR 2023-00987, dated Jun. 21, 2023 (128 pages).
Petition for Inter Partes Review for U.S. Pat. No. 10,854,683, Case No. IPR 2023-00988, dated Jun. 21, 2023 (85 pages).
Declaration of P. Morgan Pattison, Exhibit 1003 in Petition for Inter Partes Review for U.S. Pat. No. 10,854,683, Case No. IPR 2023-00988, dated Jun. 21, 2023 (126 pages).
Petition for Inter Partes Review for U.S. Pat. No. 11,594,578, Case No. IPR 2023-01075, dated Jun. 21, 2023 (91 pages).
Declaration of P. Morgan Pattison, Exhibit 1003 in Petition for Inter Partes Review for U.S. Pat. No. 11,594,578, Case No. IPR 2023-01075, dated Jun. 21, 2023 (128 pages).
Certified English Translation of Murai et al., JP 4496852 B2, May 4, 2023 (16 pages).
Galaxy S4 Images, attached to the Petition to Invalidate JP Patent No. 6748268, dated Apr. 28, 2023 (1 page).
Samsung Galaxy S4 Product Information, attached to the Petition to Invalidate JP Patent No. 6748268, dated Apr. 28, 2023 (5 pages).
Samsung Galaxy S4 Product Listing, attached to the Petition to Invalidate JP Patent No. 6748268, dated Apr. 28, 2023 (7 pages).
U.S. Notice of Allowance from U.S. Appl. No. 18/296,330, dated Feb. 7, 2024, 8 pages.
U.S. Office Action for U.S. Appl. No. 17/396,613, dated Feb. 15, 2024, 38 pages.
U.S. Notice of Allowance dated Jun. 26, 2024, issued in U.S. Appl. No. 18/296,330 (5 pages).
U.S. Notice of Allowance dated Jul. 23, 2024, issued in U.S. Appl. No. 17/396,613 (5 pages).
Office Action issued in U.S. Appl. No. 18/443,230 on Oct. 18, 2024.
Judgment Determining No Challenged Claim Unpatentable of Inter Partes Review Case No. IPR2023-01075 of U.S. Pat. No. 11,594,578 B2, dated Jan. 6, 2025, 34 pages.
Judgment Final Written Decision: Determining Some Challenged Claims Unpatentable Granting-in-Part Petitioner's First Motion to Strike Dismissing Petitioner's Second Motion to Strike Dismissing Petitioner's Motion to Exclude of Inter Partes Review Case No. IPR2023-00988 of U.S. Pat. No. 10,854,683 B2, dated Jan. 6, 2025, 103 pages.
Judgment Final Written Decision: Determining Some Challenged Claims Unpatentable Granting-in-Part Petitioner's First Motion to Strike Dismissing Petitioner's Second Motion to Strike Dismissing Petitioner's Motion to Exclude of Inter Partes Review Case No. IPR2023-00987 of U.S. Pat. No. 9,818,803 B2, dated Jan. 6, 2025, 124 pages.
Notice of Trial Decision, with English Machine Translation, dated Dec. 26, 2024 for Japanese Patent No. 6672194, corresponding to JP Patent Application 2017-22225, 175 pages.
U.S. Notice of Allowance dated Feb. 6, 2025, issued in U.S. Appl. No. 18/443,230, 5 pages.

PIXEL ARRANGEMENT STRUCTURE FOR ORGANIC LIGHT EMITTING DIODE DISPLAY

CROSS-REFERENCE TO RELATED APPLICATIONS

This application is a continuation of U.S. patent application Ser. No. 17/005,753, filed Aug. 28, 2020, which is a continuation of U.S. patent application Ser. No. 13/872,018, filed Apr. 26, 2013, now U.S. Pat. No. 10,832,616, which claims priority to and the benefit of Korean Patent Application No. 10-2013-0044993, filed in the Korean Intellectual Property Office on Apr. 23, 2013, and is a continuation in part of U.S. patent application Ser. No. 13/614,197, filed Sep. 13, 2012, now U.S. Pat. No. 9,818,803, which claims priority to and the benefit of Korean Patent Application No. 10-2012-0022967, filed in the Korean Intellectual Property Office on Mar. 6, 2012. The entire contents of all of the above applications are incorporated herein by reference.

BACKGROUND

1. Field

Aspects of embodiments of the present invention relate generally to a pixel arrangement structure for an organic light emitting diode (OLED) display.

2. Description of the Related Art

A display device is a device that displays an image. Recently, an OLED display has been drawing attention.

The OLED display has a self-luminous characteristic. Because the OLED display does not need a separate light source, unlike a liquid crystal display, it can have a relatively smaller thickness and weight than liquid crystal displays. In addition, the OLED display exhibits high-quality characteristics such as low power consumption, high luminance, high response speed, etc.

In general, the OLED display includes a plurality of pixels for emitting light of different colors. The plurality of pixels emit light to display an image.

Here, the pixel refers to a minimum unit for displaying the images. For instance, there may be a gate line, a data line, and a power line such as a driving power line to drive each pixel. In addition, there may be an insulation layer such as a pixel definition layer to define an area and a shape of each pixel. Further, each pixel may be positioned between its neighboring pixels.

An organic emission layer included in the pixel of an OLED display may be deposited and formed by using a mask such as a fine metal mask (FMM). When reducing a gap between the neighboring pixels to obtain a high aperture ratio of the pixels, deposition reliability may be deteriorated. On the other hand, when increasing the gap between the pixels to improve the deposition reliability, the aperture ratio of the pixels may be deteriorated.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention relate generally to a pixel arrangement structure for an OLED display. More particularly, aspects of embodiments of the present invention relate to a pixel arrangement structure of an OLED display that displays an image by emitting light through a plurality of pixels.

An exemplary embodiment of the present invention provides a pixel arrangement structure for an OLED display having an improved aperture ratio of each of the pixels while efficiently setting up gaps between the pixels.

According to an exemplary embodiment of the present invention, a pixel arrangement structure of an organic light emitting diode display is provided. The pixel arrangement structure includes: a first pixel having a center coinciding with a center of a virtual square; a second pixel separated from the first pixel and having a center at a first vertex of the virtual square; and a third pixel separated from the first pixel and the second pixel, and having a center at a second vertex neighboring the first vertex of the virtual square.

The second pixel may include a pair of second pixels. The second pixels may be separated from each other by the first pixel.

The third pixel may include a pair of third pixels. The third pixels may be separated from each other by the first pixel.

The second pixels and the third pixels may enclose the first pixel in the virtual square.

The first pixel, the second pixels, and the third pixels may have polygonal shapes. The second pixels and the third pixels may have a larger area than the first pixel.

The first pixel may have a quadrilateral shape. The second pixels and the third pixels may have hexagonal or octagonal shapes.

The second pixels and the third pixels may have octagonal shapes.

The second pixels and the third pixels may have a same area. A distance between the first pixel and the second pixels, a distance between the first pixel and the third pixels, and a distance between the second pixels and the third pixels may be a same first length.

The first pixel may include a plurality of first pixels. The plurality of first pixels may have a same quadrilateral shape. A distance between neighboring ones of the plurality of first pixels may be a second length that is longer than the first length.

The second pixels may have a larger area than the third pixels. A distance between the second pixels and the third pixels may be a first length. A distance between the first pixel and the second pixels, and a distance between the first pixel and the third pixels may be a same second length.

The first pixel may include a plurality of first pixels. The plurality of first pixels may have a same quadrilateral shape. A distance between neighboring ones of the plurality of first pixels may be a third length that is longer than the first length and the second length.

The first pixel may include a plurality of first pixels. Neighboring ones of the plurality of first pixels may have quadrilateral shapes that are symmetrical to each other. A distance between the neighboring ones of the plurality of first pixels may be a third length that is longer than the first length and the second length.

The first pixel may include a plurality of first pixels. Neighboring ones of the plurality of first pixels may have quadrilateral shapes that are symmetrical to each other.

The second pixels may have a larger area than the third pixels.

The third pixels may have a larger area than the second pixels.

The first pixel, the second pixel, and the third pixel may be configured to emit different color lights.

The first pixel, the second pixel, and the third pixel may be configured to emit green light, blue light, and red light, respectively.

According to an exemplary embodiment of the present invention, a pixel arrangement structure of an organic light emitting diode (OLED) display is provided. The pixel arrangement structure includes: a first pixel having a center coinciding with a center of a virtual square; a second pixel separated from the first pixel and having a center at a first vertex of the virtual square; and a third pixel separated from the first pixel and the second pixel, and having a center at a second vertex neighboring the first vertex of the virtual square. The first pixel, the second pixel, and the third pixel have polygonal shapes.

In one embodiment, the second pixel includes a pair of second pixels, and the second pixels are separated from each other by the first pixel.

In one embodiment, the third pixel includes a pair of third pixels, and the third pixels are separated from each other by the first pixel.

In one embodiment, the second pixel includes a pair of second pixels, the third pixel includes a pair of third pixels, and the second pixels and the third pixels enclose the first pixel in the virtual square.

In one embodiment, each of the second pixels and the third pixels is larger in area than the first pixel.

In one embodiment, the first pixel has an octagonal shape, and at least one of the second pixel or the third pixel has an octagonal shape.

In one embodiment, the first pixel has an octagonal shape, and one of the second pixel or the third pixel has a hexagonal shape and an other of the second pixel or the third pixel has a quadrilateral shape.

In one embodiment, the virtual square includes a pair of virtual squares sharing a common side, the first pixel includes a pair of first pixels having centers respectively coinciding with centers of the virtual squares, and the first pixels have octagonal shapes that are symmetrical to each other.

In one embodiment, each of the second pixels is larger in area than each of the third pixels.

In one embodiment, a distance between the first pixel and the second pixels as well as a distance between the first pixel and the third pixels is a same first length.

In one embodiment, the virtual square includes a pair of virtual squares sharing a common side, the first pixel includes a pair of first pixels having centers respectively coinciding with centers of the virtual squares, a distance between each of the second pixels and the third pixels is a same second length, and a distance between the first pixels is a third length that is longer than the first length and the second length.

In one embodiment, the first pixel, the second pixel, and the third pixel are configured to emit different color light.

In one embodiment, the first pixel is configured to emit green light, one of the second pixel or the third pixel is configured to emit blue light, and an other of the second pixel or the third pixel is configured to emit red light.

According to an exemplary embodiment of the present invention, the pixel arrangement structure of the OLED display improves the aperture ratio of the pixels while efficiently setting up the gaps between the pixels.

DETAILED DESCRIPTION

Figure 1:
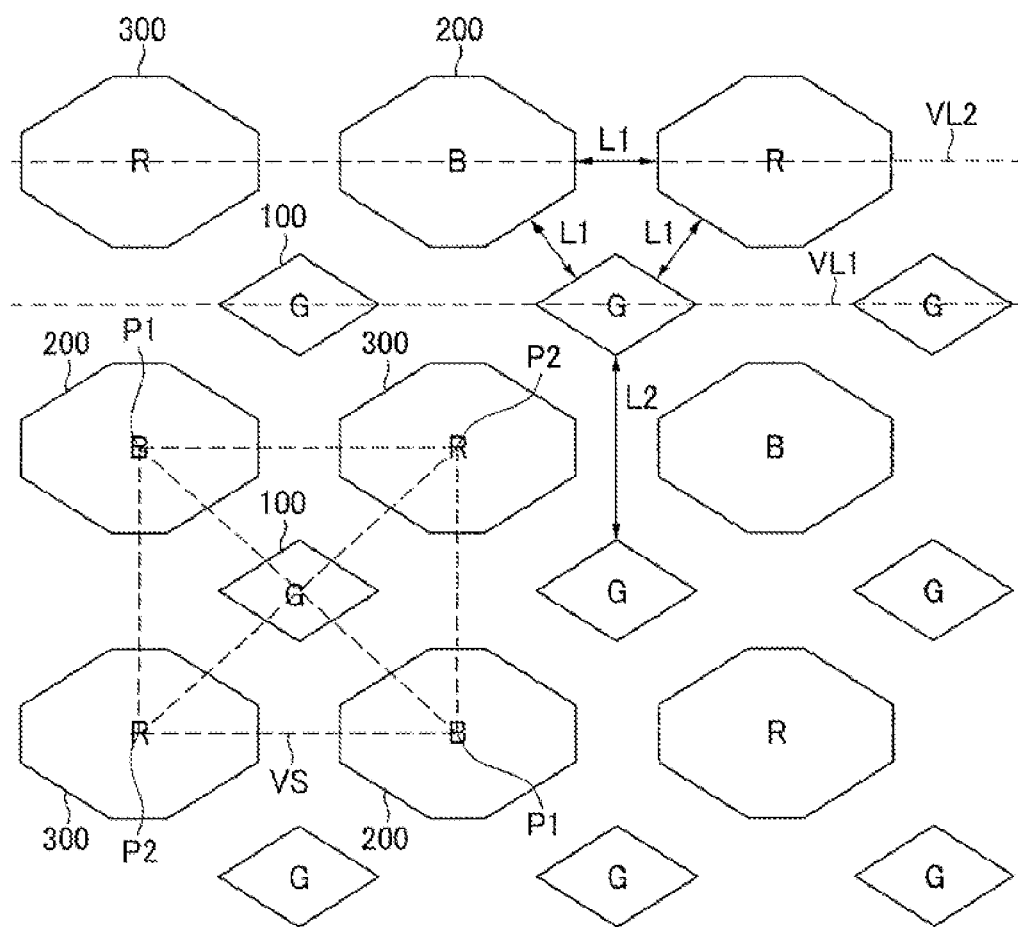
FIG. 1 is a view of a pixel arrangement structure of an OLED display according to a first exemplary embodiment.

Several exemplary embodiments according to the present invention are described hereinafter in detail with reference to the accompanying drawing to allow one of ordinary skill in the art to practice the invention without undue experimentation. The present invention can be embodied in several different forms, and is not limited to the exemplary embodiments that are described herein.

In order to clarify the description of embodiments of the present invention, parts that are not related to the invention may be omitted. In addition, the same elements or equivalents are referred to with the same reference numerals throughout the specification.

Further, since sizes and thicknesses of constituent members shown in the accompanying drawing may be arbitrarily given for better understanding and ease of description, the present invention is not limited to the illustrated sizes and thicknesses.

In addition, unless explicitly described to the contrary, the word "comprise" and variations such as "comprises" or "comprising" will be understood to imply the inclusion of stated elements but not the exclusion of any other elements.

Nevertheless, even though each of the pixels are drawn as stereotypical polygonal shapes in the drawings, the present invention is not limited to this shape. That is, the shapes of the pixels may be modified to avoid interference with the other components of the OLED (e.g., wirings) within the spirit and scope of the appended claims.

A pixel arrangement structure (or pixel arrangement) of an OLED display according to a first exemplary embodiment will be described with reference to FIG. 1. FIG. 1 is a view schematically showing a portion of pixels forming an OLED display.

As shown in FIG. 1, the pixel arrangement structure of the OLED display includes a plurality of first pixels 100, a plurality of second pixels 200, and a plurality of third pixels 300. Here, the pixel refers to a minimum unit for displaying an image (for example, the minimum addressable unit of the display).

Further, among the first pixels 100, the second pixels 200, and the third pixels 300, power lines for driving each of the pixels, such as a gate line, a data line, a driving power line, and the like, may be located. In addition, an insulation layer, such as a pixel defining layer, for defining each of the pixels may be disposed. Finally, an OLED including an anode, an organic emission layer, and a cathode to correspond to each of the first pixels 100, the second pixels 200, and the third pixels 300 may be disposed. These configurations are technologies known in the art and further description thereof is omitted for ease of description. A shape of each of the pixels may be defined by the power lines, the pixel defining layer, the anode, or the like, but is not limited thereto.

In the pixel arrangement of FIG. 1, each of the first pixels 100 has a smaller area than neighboring second pixels 200 and third pixels 300, and has a quadrilateral (i.e., four-sided) shape among polygon shapes. For example, in the pixel arrangement of FIG. 1, each of the first pixels 100 has the same quadrilateral shape (e.g., a square or rhombus). The first pixels 100 are spaced apart from each other and arranged in rows, such as along a first virtual straight line VL1. The first pixels 100 emit green light, and may include an organic emission layer for emitting green light.

The second pixels 200 are arranged diagonally with respect to the first pixels 100, such as at first vertices P1 along one diagonal of a virtual square VS having one of the first pixels 100 as a center point (or center) of the virtual square VS. In a similar fashion, the third pixels 300 are arranged diagonally with respect to the first pixels 100, such as at second vertices P2 along the other diagonal of the virtual square VS.

In the virtual square VS, each of the second pixels 200 is separated from the first pixel 100, and is centered at one of the first vertices P1 of the virtual square VS. Each of the second pixels 200 has a larger area than the neighboring first pixel 100 and has an octagonal (i.e., eight-sided) shape. In FIG. 1, the second pixels 200 each have the same octagonal shape. In addition, the second pixels 200 are arranged diagonally and separated from each other by the first pixels 100. The second pixels 200 emit blue light, and may include an organic emission layer for emitting blue light.

In a similar fashion, in the virtual square VS, each of the third pixels 300 is separated from the first pixel 100 and the second pixels 200, and is centered at one of the second vertices P2 neighboring the first vertices P1 of the virtual square VS. Each of the third pixels 300 has a larger area than the neighboring first pixel 100 and the same area as each of the second pixels 200. Further, the third pixels have an octagonal shape (e.g., similar to or the same as the second pixels 200). In FIG. 1, the third pixels 300 each have the same octagonal shape. In addition, the third pixels 300 are arranged diagonally and separated from each other by the first pixels 100. The third pixels 300 emit red light, and may include an organic emission layer for emitting red light.

The third pixels 300 and the second pixels 200 are spaced apart from each other and alternately arranged in rows, such as along a second virtual straight line VL2. In a similar fashion, the third pixels 300 and the second pixels 200 are spaced apart from each other and alternately arranged in columns. Accordingly, in the virtual square VS, two of the second pixels 200 having their corresponding centers positioned at the first vertices P1 and two of the third pixels 300 having their corresponding centers positioned at the second vertices P2 to enclose a corresponding one of the first pixels 100 (e.g., in the virtual square VS).

As described above, the center of each of the second pixels 200 is positioned at one of the first vertices P1 of the virtual square VS. In addition, the center of the corresponding first pixel 100 is the center of the virtual square VS. Further, the center of each of the third pixels 300 is positioned at one of the second vertices P2. Moreover, the second pixels 200 and the third pixels 300 each have the same area.

As a non-limiting example, the distance (e.g., a shortest distance) between one of the first pixels 100 and an adjacent one of the second pixels 200 is a first length L1, the distance between one of the first pixels 100 and an adjacent one of the third pixels 300 is the same first length L1, and the distance between one of the second pixels 200 and an adjacent one of the third pixels 300 is the same first length L1, as shown in FIG. 1. In addition, the distance (e.g., a shortest distance) between the neighboring first pixels 100 is a second length L2 that is longer than the first length L1. It should be noted that L1, L2, L3, . . . may be used throughout to represent shortest distances between corresponding pixels.

Therefore, the gap of the first length L1 is formed between adjacent pairs of the first pixels 100 and the second pixels 200, between adjacent pairs of the first pixels 100 and the third pixels 300, and between adjacent pairs of the second pixels 200 and the third pixels 300. In addition, the gap of the second length L2 that is longer than the first length L1 is formed between the neighboring ones of the first pixels 100. This results in improved deposition reliability when using a fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, a manufacturing time and manufacturing cost of the entire OLED display may be reduced and the display quality of the image of the OLED display may be improved.

As described above, in the pixel arrangement structure of the OLED display of FIG. 1, the first pixels 100, the second pixels 200, and the third pixels 300 have polygonal shapes (e.g., the first pixels have a quadrilateral shape and the second pixels 200 and the third pixels 300 have an octagonal shape). In addition, it is worth considering that the deposition process of the organic emission layer is one of the unique manufacturing characteristics of the OLED display. Accordingly, to improve the deposition reliability of the organic emission layer in the deposition process using the fine metal mask and to improve the aperture ratio of the first pixels 100, the second pixels 200, and the third pixels 300, the center of each of the first pixels 100 is positioned at the center of a virtual square VS formed by a first pair of diagonal vertices P1 and a second pair of diagonal vertices P2. In the virtual square VS, the centers of a pair of the second pixels 200 are positioned at the first vertices P1, and the centers of a pair of the third pixels 300 are positioned at the second vertices P2.

In addition, in the pixel arrangement structure of the OLED display of FIG. 1, the first pixels 100, the second pixels 200, and the third pixels 300 respectively emit green, blue, and red light. However, in pixel arrangement structures of other OLED displays, the first pixels 100, the second pixels 200, and the third pixels 300 may emit light of different colors. For example, at least one of the second pixels 200 or the third pixels may emit white light.

Next, a pixel arrangement structure of an OLED display according to a second exemplary embodiment will be described with reference to FIG. 2. Parts that are different from the exemplary embodiment of FIG. 1 will be described, while the description of parts that are equivalent to the first exemplary embodiment may be omitted. For better comprehension and ease of description, constituent elements of the second exemplary embodiment that are the same as or similar to those of the first embodiment of FIG. 1 will have the same reference numerals.

Figure 2:
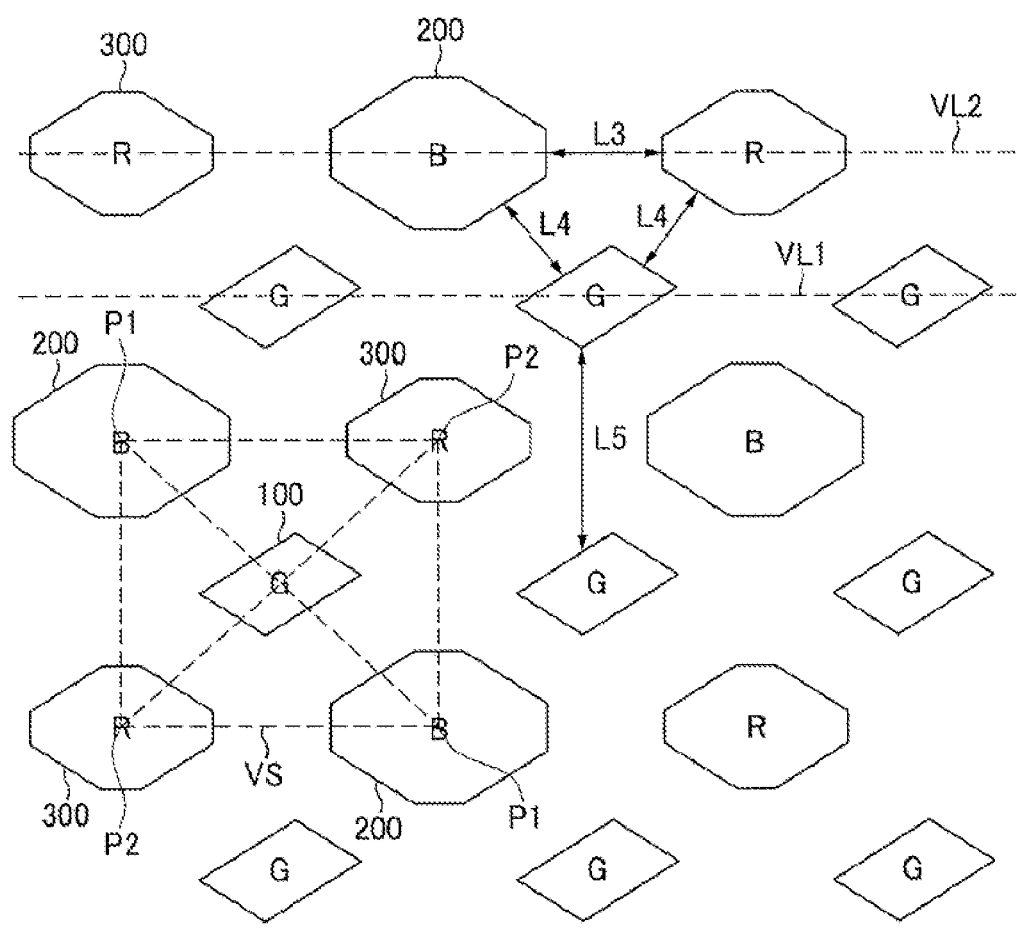
FIG. 2 is a view of a pixel arrangement structure of an OLED display according to a second exemplary embodiment.

As shown in FIG. 2, the pixel arrangement structure of the OLED display includes a plurality of first pixels 100, a plurality of second pixels 200, and a plurality of third pixels 300. The plurality of first pixels 100 have the same quadrilateral shape (e.g., a parallelogram). In addition, the second pixels 200 have a larger area than the third pixels 300. The second pixels 200 and the third pixels 300 may have polygonal shapes, such as octagonal or hexagonal (i.e., six-sided).

In a similar fashion to that of FIG. 1, the centers of a pair of the second pixels 200 are positioned at first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 2, the second pixels 200 have a larger area than the third pixels 300.

As a non-limiting example, the distance between adjacent ones of the second pixels 200 and the third pixels 300 is a third length L3, while the distance between each of the first pixels 100 and adjacent ones of the second pixels 200 or the third pixels 300 have a same fourth length L4. In addition, the distance between neighboring ones of the first pixels 100 is a fifth length L5 that is longer than the third length L3 and the fourth length L4.

Accordingly, the gap of the fourth length L4 is formed between adjacent pairs of the first pixels 100 and the second pixels 200, and between adjacent pairs of the first pixels 100 and the third pixels 300. In addition, the gap of the third length L3 is formed between adjacent pairs of the second pixels 200 and the third pixels 300. Further, the gap of the fifth length L5 that is longer than the third length L3 and the fourth length L4 is formed between the neighboring ones of the first pixels 100. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Further, in the pixel arrangement structure of the OLED display of FIG. 2, the second pixels 200 that emit blue have the shortest life span among the first pixels 100, the second pixels 200, and the third pixels 300. Accordingly, the second pixels 200 have a larger area than the third pixels 300, thereby suppressing the deterioration of the life span of the OLED display. That is, the pixel arrangement structure of the OLED display of FIG. 2 provides improved life span.

Next, a pixel arrangement structure of an OLED display according to a third exemplary embodiment will be described with reference to FIG. 3. Parts that are different from the above exemplary embodiments will be described, while the description of parts that are equivalent to the above exemplary embodiments may be omitted. For better comprehension and ease of description, constituent elements of the third exemplary embodiment that are the same as or similar to the above exemplary embodiments will have the same reference numerals.

Figure 3:
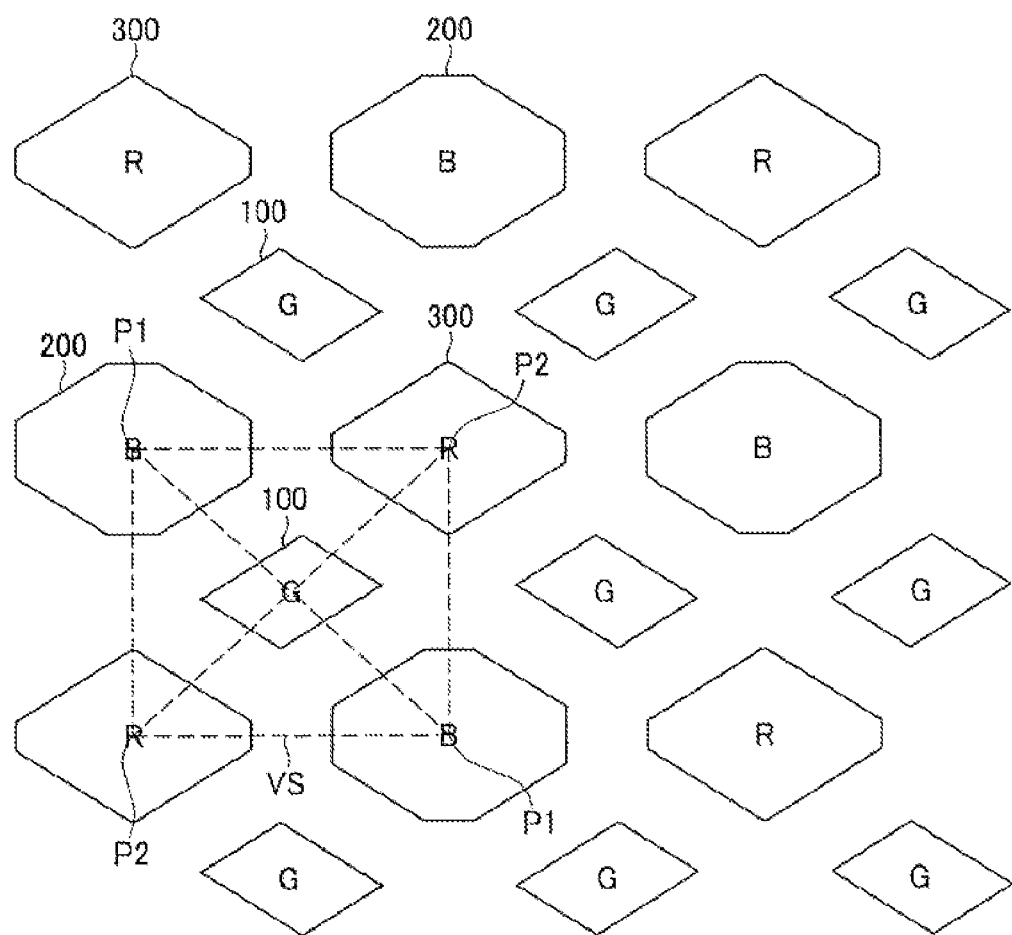
FIG. 3 is a view of a pixel arrangement structure of an OLED display according to a third exemplary embodiment.

As shown in FIG. 3, the pixel arrangement structure of the OLED display includes a plurality of first pixels 100, a plurality of second pixels 200, and a plurality of third pixels 300. Among the plurality of first pixels 100, the neighboring first pixels 100 have a quadrilateral shape (e.g., parallelogram) and are symmetrical to each other. In addition, the second pixels 200 have a larger area than the third pixels 300. The second pixels 200 and the third pixels may have polygonal shapes (e.g., hexagonal or octagonal).

In a similar fashion to that of FIGS. 1-2, the centers of a pair of the second pixels 200 are positioned at first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 3, the neighboring first pixels 100 have a quadrilateral shape and are symmetrical to each other, while the second pixels 200 have a larger area than the third pixels 300. This results in improved deposition reliability in the deposition process using the fine metal mask to form the green, blue, and red organic emission layers respectively included in the first pixels 100, the second pixels 200, and the third pixels 300.

In addition, by placing each of the first pixels 100 between a pair of the second pixels 200 and between a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Further, in the pixel arrangement structure of the OLED display of FIG. 3, the second pixels 200 that emit blue have the shortest life span among the first pixels 100, the second pixels 200, and the third pixels 300. Accordingly, the second pixels 200 have a larger area than the third pixels 300, thereby suppressing the deterioration of the life span of the OLED display. That is, the pixel arrangement structure of the OLED display provides improved life span.

Next, a pixel arrangement structure of an OLED display according to a fourth exemplary embodiment will be described with reference to FIG. 4. Parts that are different from the above exemplary embodiments will be described, while the description of parts that are equivalent to the above exemplary embodiments may be omitted. For better comprehension and ease of description, constituent elements of the fourth exemplary embodiment that are the same as or similar to the above exemplary embodiments will have the same reference numerals.

Figure 4:
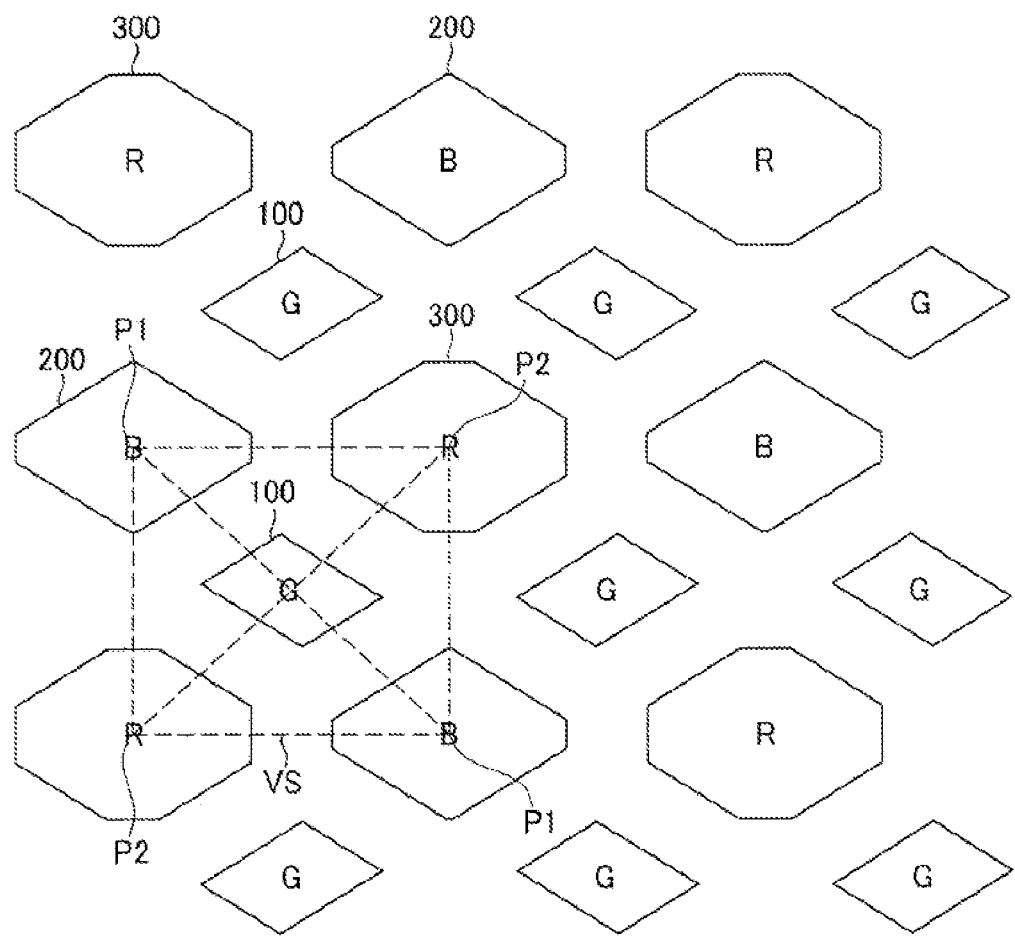
FIG. 4 is a view of a pixel arrangement structure of an OLED display according to a fourth exemplary embodiment.

As shown in FIG. 4, the pixel arrangement structure of the OLED display includes a plurality of first pixels 100, a plurality of second pixels 200, and a plurality of third pixels 300. Among the plurality of first pixels 100, the neighboring first pixels 100 have a quadrilateral shape (e.g., parallelogram) and are symmetrical to each other. In addition, the third pixels 300 have a larger area than the second pixels 200. The second pixels 200 and the third pixels may have polygonal shapes (e.g., hexagonal or octagonal).

In a similar fashion to that of FIGS. 1-3, the centers of a pair of the second pixels 200 are positioned at the first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 4, the neighboring first pixels 100 have a quadrilateral shape and are symmetrical to each other, while the third pixels 300 have a larger area than the second pixels 200. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved.

Accordingly, the manufacturing time and the manufacturing cost of the OLED display may be reduced and the display quality of the image of the OLED display may be improved.

Next, a pixel arrangement structure of an OLED display according to a fifth exemplary embodiment will be described with reference to FIG. 5. Parts that are different from the above exemplary embodiments will be described, while the description of parts that are equivalent to the above exemplary embodiments may be omitted. For better comprehension and ease of description, constituent elements of the fifth exemplary embodiment that are the same as or similar to the above exemplary embodiments will have the same reference numerals.

Figure 5:
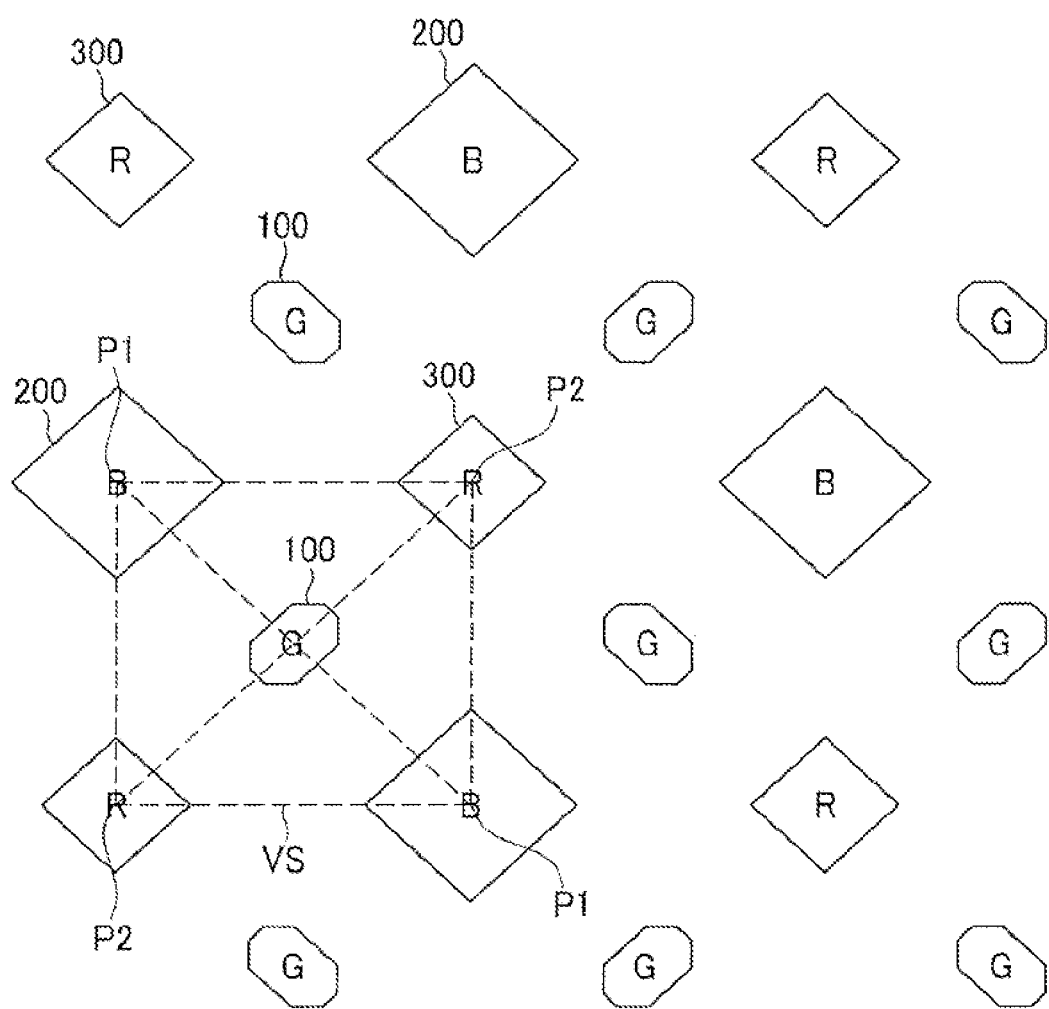
FIG. 5 is a view of a pixel arrangement structure of an OLED display according to a fifth exemplary embodiment.

As shown in FIG. 5, the pixel arrangement structure of the OLED display includes a plurality of first pixels 100, a plurality of second pixels 200, and a plurality of third pixels 300. Among the plurality of first pixels 100, the neighboring first pixels 100 have a octagonal shape and are symmetrical to each other. In addition, the second pixels 200 have a larger area than the third pixels 300. The second pixels 200 and the third pixels 300 may have quadrilateral shapes (e.g., rhombus).

In a similar fashion to that of FIGS. 1-3, the centers of a pair of the second pixels 200 are positioned at the first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 5, the neighboring first pixels 100 have a octagonal shape and are symmetrical to each other, while the second pixels 200 have a larger area than the third pixels 300. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Figure 6:
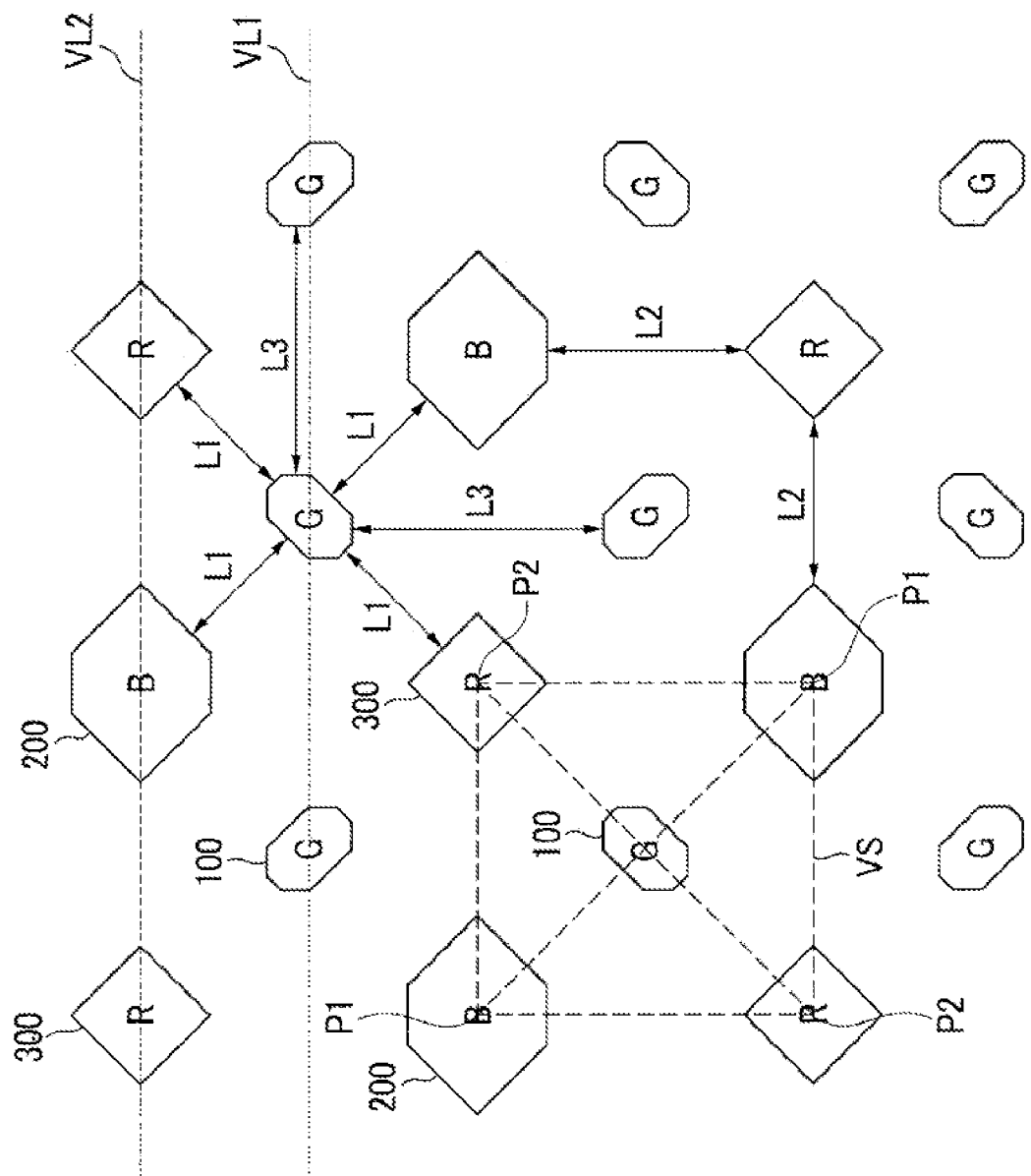
FIG. 6 is a view of a pixel arrangement structure of an OLED display according to a sixth exemplary embodiment.

Hereinafter, a pixel arrangement structure (or pixel arrangement) of an OLED display according to an exemplary embodiment will be described with reference to FIG. 6. FIG. 6 is a view schematically showing a portion of pixels forming an OLED display.

FIG. 6 shows a pixel arrangement structure of an OLED display according to an exemplary embodiment of the present invention.

As shown in FIG. 6, the pixel arrangement structure of the OLED display includes a plurality of first pixels 100, a plurality of second pixels 200, and a plurality of third pixels 300.

According to one embodiment, the pixel refers to a minimum unit for displaying an image (for example, the minimum addressable unit of the display).

In one embodiment, among the first pixels 100, the second pixels 200, and the third pixels 300, power lines for driving each of the pixels, such as a gate line, a data line, a driving power line, and the like, are located. In addition, in one embodiment, an insulation layer, such as a pixel defining layer, for defining each of the pixels is disposed. Further, in one embodiment, an OLED including an anode, an organic emission layer, and a cathode to correspond to each of the first pixels 100, the second pixels 200, and the third pixels 300 is disposed. These configurations are technologies known in the art and further description thereof is omitted for ease of description. In one embodiment, the shape of each of the pixels is defined by the power lines, the pixel defining layer, the anode, or the like.

In the pixel arrangement of FIG. 6, each of the first pixels 100 has a smaller area (e.g., is smaller in area) than neighboring second pixels 200 and third pixels 300, and has a polygon shape. In FIG. 6, the first pixels 100 have an octagonal shape among the polygon shapes. In other embodiments, the first pixels 100 have one or more of various polygon shapes such as a triangle, a rectangle, a pentagon, a hexagon, a heptagon, and the like. For example, the first pixels 100 that neighbor each other among the plurality of first pixels 100 have hexagon shapes that are symmetrical to each other. In one embodiment, each of the plurality of first pixels 100 has the same hexagonal shape.

In one embodiment, the first pixels 100 are spaced apart from each other and arranged in rows, such as along a first virtual straight line VL1. In one embodiment, the first pixels 100 emit green light, and include an organic emission layer for emitting green light. In other embodiments, the first pixels 100 include an organic emission layer that emits light of one or more of various colors such as blue, red, or white color for emitting blue light, red light, or white light.

In FIG. 6, the second pixels 200 are arranged diagonally with respect to the first pixels 100, namely at first vertices P1 along one diagonal of a virtual square VS having one of the first pixels 100 as a center point (or center) of the virtual square VS. In a similar fashion, in FIG. 6, the third pixels 300 are arranged diagonally with respect to the first pixels 100, namely at second vertices P2 along the other diagonal of the virtual square VS.

In the virtual square VS of FIG. 6, each of the second pixels 200 is separated from the first pixel 100, and is centered at one of the first vertices P1 of the virtual square VS. Each of the second pixels 200 has a larger area than the neighboring first pixel 100 and the neighboring third pixels 300, and has a hexagonal shape. In other embodiments, the second pixels 200 have one or more of various polygonal shapes such as a triangle, a rectangle, a pentagon, a hexagon, a heptagon, and the like.

In FIG. 6, the second pixels 200 each have the same hexagonal shape. In addition, the second pixels 200 are arranged diagonally and separated from each other by the first pixels 100. In one embodiment, the second pixels 200 emit blue light, and include an organic emission layer for emitting blue light. In other embodiments, the second pixels 200 include an organic emission layer that emits light of one or more of various colors such as red, green, or white for emitting red light, green light, or white light.

In a similar fashion, in the virtual square VS of FIG. 6, each of the third pixels 300 is separated from the first pixel 100 and the second pixels 200, and is centered at one of the second vertices P2 neighboring the first vertices P1 of the virtual square VS. Each of the third pixels 300 has a larger area than the neighboring first pixel 100 and a smaller area than the neighboring second pixels 200. The third pixels 300 has a quadrilateral shape among polygon shapes. In other embodiments, the third pixels 300 have one or more of various polygonal shapes such as a triangle, a rectangle, a pentagon, a hexagon, a heptagon, and the like.

In FIG. 6, the third pixels 300 each have the same quadrilateral shape. In addition, the third pixels 300 are arranged diagonally and separated from each other by the first pixels 100. In one embodiment, the third pixels 300 emit red light, and include an organic emission layer for emitting red light. In other embodiments, the third pixels 300 include an organic emission layer that emits light of one or more of various colors such as blue, green, or white for emitting emit blue light, green light, or white light.

In FIG. 6, each of the second pixels 200 and the third pixels 300 has a hexagonal shape and a quadrilateral shape, respectively. In another embodiment, each of the second pixels 200 and the third pixels 300 respectively has a quadrilateral shape and a hexagonal shape. That is, in this other embodiment, one of the second pixels 200 or the third pixels 300 has a hexagonal shape and the other has a quadrilateral shape.

In one embodiment, the first pixels 100, the second pixels 200, and the third pixels 300 respectively emit green light, blue light, and red light. In other embodiments, the first pixels 100, the second pixels 200, and the third pixels 300 emit light of the same color. In still other embodiments, the first pixels 100, the second pixels 200, and the third pixels 300 emit light of different colors. In some embodiments, the first pixels 100 emit green light, and one of the second pixels 200 or the third pixels 300 emit blue light while the other emit red light.

In FIG. 6, third pixels 300 and the second pixels 200 are spaced apart from each other and alternately arranged in rows, such as along a second virtual straight line VL2. In a similar fashion, in FIG. 6, the third pixels 300 and the second pixels 200 are spaced apart from each other and alternately arranged in columns. Accordingly, in FIG. 6, in the virtual square VS, two of the second pixels 200 have their corresponding centers positioned at the first vertices P1 and two of the third pixels 300 have their corresponding centers positioned at the second vertices P2 to enclose a corresponding one of the first pixels 100 in the virtual square VS.

As described and illustrated in FIG. 6, the center of each of the second pixels 200 is positioned at one of the first vertices P1 of the virtual square VS. In addition, the center of the corresponding first pixel 100 is the center of the virtual square VS. Further, the center of each of the third pixels 300 is positioned at one of the second vertices P2. Therefore, the plurality of second pixels 200 of which the centers are positioned at the first vertices P1 and the plurality of third pixels 300 of which the centers are positioned at the second vertices P2 respectively enclose one of the first pixels 100 in the virtual square VS.

Further, and as illustrated in FIG. 6, the first pixels 100, the second pixels 200, and the third pixels 300 have polygon shapes. In FIG. 6, the distance between one of the first pixels 100 and an adjacent one of the second pixels 200 as well as a distance between one of the first pixels 100 and an adjacent one of the third pixels 300 is the same first length L1. In addition, a distance between one of the second pixels 200 and an adjacent one of the third pixels 300 is a second length L2 that is different from the first length L1. Further, in FIG. 6, a distance between neighboring first pixels 100 is a third length L3 that is longer than the first length L1 and the second length L2.

For example, in some embodiments, the first length L1 is between 15 um (micrometers) and 35 um, the second length L2 is between 20 um and 45 um, and the third length L3 is between 25 um and 65 um.

Therefore, gaps of the first length L1 are formed between adjacent pairs of the first pixels 100 and the second pixels 200, and between adjacent pairs of the first pixels 100 and the third pixels 300. In addition, the gaps of the third length L3 that is longer than the first length L1 are formed between the neighboring ones of the first pixels 100. In one embodiment, this results in improved deposition reliability in the deposition process using the fine metal mask to form the green, blue, and red organic emission layers respectively included in the first pixels 100, the second pixels 200, and the third pixels 300.

In addition, in one embodiment, the plurality of second pixels 200 and the plurality of third pixels 300 are arranged to enclose the first pixels 100 in the virtual squares VS so that an aperture ratio of each of the first pixels 100, the second pixels 200, and the third pixels 300 can be improved. Accordingly, in one embodiment, the manufacturing time and the manufacturing cost of the OLED display is reduced and the display quality of the image of the OLED display is improved.

Further, in the pixel arrangement structure of the OLED display of FIG. 6 according to an exemplary embodiment of the present invention, the second pixels 200 that emit blue light have the shortest life span among the first pixels 100, the second pixels 200, and the third pixels 300. Accordingly, the second pixels 200 have a larger area than the first pixels 100 and the third pixels 300, thereby suppressing the deterioration of the life span of the OLED display. That is, in one embodiment, the pixel arrangement structure of the OLED display of FIG. 6 provides improved life span.

As described above, in the pixel arrangement structure of the OLED display of FIG. 6 according to an exemplary embodiment of the present invention, the first pixels 100, the second pixels 200, and the third pixels 300 have simple polygonal shapes such as an octagon, a hexagon, and a quadrangle. In consideration of the deposition process of the organic emission layer, which in one embodiment is a unique manufacturing feature of the OLED display, a center of one of the first pixels 100 is positioned at the center of the virtual square VS, a center of one of the second pixels 200 is positioned at the first vertex P1, and a center of one of the third pixels 300 is positioned at the second vertex P2 to both improve deposition reliability of the organic emission layer in the deposition process using the fine metal mask and improve an aperture of each of the first, second, and third pixels 100, 200, and 300.

That is, according to an exemplary embodiment of the present invention as illustrated in FIG. 6, the pixel arrangement structure of the OLED display includes a plurality of first pixels 100 having an octagonal shape, a plurality of second pixels 200 having a hexagonal shape, and a plurality of third pixels 300 having a quadrilateral shape. In one or more embodiments, the shapes and arrangement of the first pixels 100, the second pixels 200, and the third pixels 300 improve the deposition reliability of the organic emission layer while also improving the aperture ratio of each of the first pixels 100, the second pixels, 200, and the third pixels 300.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME SYMBOLS first pixel 100, second pixels 200, third pixels 300

What is claimed is:

1. A pixel arrangement structure comprising a plurality of individually addressable pixels for displaying an image on a display, the plurality of individually addressable pixels being minimum addressable units of the display and comprising:
a plurality of first pixels;
a plurality of second pixels spaced from the first pixels, the second pixels being alternately arranged with the first pixels along a first direction; and
a plurality of third pixels spaced from the first pixels and the second pixels, the third pixels being alternately arranged with the first pixels along a second direction crossing the first direction,
wherein a shortest distance between two immediately adjacent ones of the first pixels is greater than a shortest distance between any of the plurality of second pixels and any of the plurality of third pixels that are nearest to each other,
wherein the shortest distance between the two immediately adjacent ones of the first pixels is different from a shortest distance between any two of the plurality of second pixels,
wherein each of the first pixels has a convex shape such that a line bisecting the first pixel along a long axis thereof has a greater length than a line bisecting the first pixel along a shortest axis thereof, the long axis being perpendicular to the shortest axis,
wherein each of the first pixels is located between two adjacent ones of the second pixels along a direction of the shortest axis,
wherein each of the first pixels is located between two adjacent ones of the third pixels along a direction of the long axis, and
wherein at least one of the first pixels is symmetric about at least one of the long axis or the shortest axis.

2. The pixel arrangement structure of claim 1, wherein at least two of the first pixels are aligned only with the second pixels in a first set of pixels arranged along the first direction from among the plurality of individually addressable pixels.

3. The pixel arrangement structure of claim 1, wherein at least two of the first pixels are aligned only with the third pixels in a second set of pixels arranged along the second direction from among the plurality of individually addressable pixels.

4. The pixel arrangement structure of claim 1, wherein a first first pixel and a second first pixel from among the plurality of first pixels are aligned along the first direction with a second pixel from among the plurality of second pixels interposed therebetween, and have a symmetrical relationship with respect to a center of the second pixel.

5. The pixel arrangement structure of claim 1, wherein a first first pixel and a second first pixel from among the plurality of first pixels are aligned along the second direction with a third pixel from among the plurality of third pixels interposed therebetween, and have a symmetrical relationship with respect to a center of the third pixel.

6. The pixel arrangement structure of claim 1, wherein the shortest distance between the two immediately adjacent ones of the first pixels is greater than a length of each side of the two immediately adjacent ones of the first pixels.

7. The pixel arrangement structure of claim 1, wherein a first second pixel of the plurality of second pixels, a first third pixel of the plurality of third pixels, a second second pixel of the plurality of second pixels, and a second third pixel of the plurality of third pixels are respectively located at four vertexes of a virtual square, and
wherein a first pixel of the plurality of first pixels is located at a center of the virtual square.

8. The pixel arrangement structure of claim 7, wherein the second pixels and the third pixels are alternately arranged in a first set of pixels that are aligned along a third direction that is parallel to a side of the virtual square from among the plurality of individually addressable pixels.

9. The pixel arrangement structure of claim 8, wherein centers of the second pixels and the third pixels in the first set of pixels are aligned along the third direction.

10. The pixel arrangement structure of claim 8, wherein only the first pixels are arranged in a second set of pixels that are aligned along the third direction from among the plurality of individually addressable pixels.

11. The pixel arrangement structure of claim 10, wherein centers of the first pixels in the second set of pixels are aligned along the third direction.

12. The pixel arrangement structure of claim 10, wherein the first set of pixels and the second set of pixels are adjacent to one another.

13. The pixel arrangement structure of claim 10, wherein two adjacent ones of the first pixels in the second set of pixels have a symmetrical relationship with respect to a midpoint between the two adjacent ones of the first pixels in the second set of pixels.

14. The pixel arrangement structure of claim 13, wherein the two adjacent ones of the first pixels in the second set of pixels are elongated in the first direction and the second direction, respectively.

15. The pixel arrangement structure of claim 10, wherein a row or a column formed by the first pixels in the second set of pixels has a width region corresponding to a direction perpendicular to the side of the virtual square, and
wherein the width region does not overlap with at least one of the second pixels or the third pixels.

16. The pixel arrangement structure of claim 15, wherein the width region does not overlap with any of the second pixels and the third pixels.

17. The pixel arrangement structure of claim 10, wherein a shortest distance between two adjacent ones of the second pixels in the first set of pixels is greater than a shortest distance between two adjacent ones of the first pixels in the second set of pixels.

18. The pixel arrangement structure of claim 10, wherein a shortest distance between one of the second pixels in the first set of pixels and one of the third pixels in the first set of pixels that is adjacent to the one of the second pixels is shorter than a shortest distance between two adjacent ones of the first pixels in the second set of pixels.

19. The pixel arrangement structure of claim 18, wherein the two adjacent ones of the first pixels in the second set of pixels have a symmetrical relationship with respect to a midpoint between the two adjacent ones of the first pixels in the second set of pixels.

20. The pixel arrangement structure of claim 1, wherein a shortest distance between a first first pixel of the plurality of first pixels and a second pixel that is adjacent to the first first pixel in the first direction from among the plurality of second pixels is the same as a shortest distance between a second first pixel of the plurality of first pixels and a third pixel that is adjacent to the second first pixel in the second direction from among the plurality of third pixels.

21. The pixel arrangement structure of claim 1, wherein each of the first pixels, the second pixels, and the third pixels has a shape having a plurality of outwardly convex portions.

22. The pixel arrangement structure of claim 21, wherein each of the first pixels, the second pixels, and the third pixels has at least four sides, and wherein two adjacent ones of the at least four sides form each of the outwardly convex portions.

23. The pixel arrangement structure of claim 1, wherein two adjacent ones of the first pixels along a third direction have different inclination directions from each other.

24. The pixel arrangement structure of claim 23, wherein no pixel is located between the two adjacent ones of the first pixels along the third direction.

25. The pixel arrangement structure of claim 23, wherein at least one of the first pixels has a generally octagonal shape.

26. The pixel arrangement structure of claim 1, wherein the second pixels have a different shape from the third pixels.

27. The pixel arrangement structure of claim 1, wherein the second pixels have a different size from the third pixels.

28. The pixel arrangement structure of claim 1, wherein the first pixels and the second pixels that are aligned with the first pixels along the first direction in a set of pixels from among the plurality of individually addressable pixels have a width region corresponding to a largest width of the first pixels and the second pixels in a direction perpendicular to the first direction, and
wherein the width region does not overlap with the first pixels, the second pixels, and the third pixels that are not in the set of pixels.

29. The pixel arrangement structure of claim 1, wherein the first pixels and the third pixels that are aligned with the first pixels along the second direction in a set of pixels from among the plurality of individually addressable pixels have a width region corresponding to a largest width of the first pixels and the third pixels in a direction perpendicular to the second direction, and
wherein the width region does not overlap with the first pixels, the second pixels, and the third pixels that are not in the set of pixels.

30. The pixel arrangement structure of claim 1, wherein centers of the first pixels are aligned with centers of the second pixels along the first direction.

31. The pixel arrangement structure of claim 1, wherein centers of the first pixels are aligned with centers of the third pixels along the second direction.

32. The pixel arrangement structure of claim 1, wherein the first pixels, the second pixels, and the third pixels are configured to emit different color lights, and
wherein light emitting layers of the first pixels, the second pixels, and the third pixels are respectively formed by utilizing different fine metal masks.

33. The pixel arrangement of claim 1, wherein one of the first pixels is entirely offset from every virtual line that touches a perimeter of one of the third pixels immediately adjacent to the one of the first pixels, and that extends in a third direction or in a fourth direction, wherein the third direction crosses the first direction and the second direction, and the fourth direction is perpendicular to the third direction.

34. The pixel arrangement structure of claim 1, wherein a first pixel of the first pixels is symmetric with respect to at least one of an axis extending in the first direction or an axis extending in the second direction.

35. The pixel arrangement structure of claim 1, wherein a pair of first pixels on respective sides of one of the second pixels or the third pixels are symmetric with each other with respect to the one of the second pixels or the third pixels.

36. The pixel arrangement structure of claim 1, wherein a first pixel of the first pixels has a convex shape with no vertex angle of 90 degrees.

37. The pixel arrangement structure of claim 1, wherein a first pixel of the first pixels has two sides that completely overlap with each other in the first direction.

38. The pixel arrangement structure of claim 1, wherein a first pixel of the first pixels comprises a first end portion, a center portion, and a second end portion that are sequentially arranged from a first end to a second end of the first pixel, and wherein a width of each of the first and second end portions gradually decreases from the center portion towards the respective first and second ends of the first pixel, and
wherein a line extending in the second direction and bisecting an edge of the first end portion into two portions of equal lengths passes through a center of the first pixel.

39. The pixel arrangement structure of claim 1, wherein a first pixel of the first pixels comprises a first end portion, a center portion, and a second end portion that are sequentially arranged from a first end to a second end of the first pixel, and wherein a width of each of the first and second end portions gradually decreases from the center portion towards the respective first and second ends of the first pixel, and
wherein an edge of the first end portion is symmetric with respect to a line extending in the second direction that passes through a center of the first pixel.

40. The pixel arrangement structure of claim 1, wherein, for each first pixel from among two immediately adjacent ones of the first pixels, a side of the first pixel that faces one of the second pixels immediately adjacent to the first pixel is longer than a side of the first pixel that faces one of the third pixels immediately adjacent to the first pixel.

41. The pixel arrangement structure of claim 1, wherein a total length of edges of one first pixel from among two immediately adjacent ones of the first pixels that face the other first pixel from among the two immediately adjacent ones of the first pixels is equal to a total length of edges of the other first pixel that face the one first pixel.

42. The pixel arrangement structure of claim 1, wherein any two of the first pixels that are immediately adjacent to each other have different maximum widths in at least one of the first direction or the second direction.

43. The pixel arrangement structure of claim 1, wherein a maximum width of the first pixels in at least one of the first direction or the second direction is different from a maximum width in a same direction of at least one of the second pixels or the third pixels.

44. The pixel arrangement structure of claim 1, wherein some of the first pixels are aligned with each other and are entirely located within a region extending in a third direction crossing the first and second directions, and
wherein all of the second pixels and the third pixels are located entirely outside the region.

45. The pixel arrangement structure of claim 1, wherein some of the first pixels are arranged along a third direction crossing the first and second directions, and
wherein adjacent ones of the some of the first pixels are mirror symmetric with respect to an axis extending in a fourth direction perpendicular to the third direction.

46. The pixel arrangement structure of claim 1, wherein each of the first pixels in the pixel arrangement structure has a first width along a major axis parallel to the first direction or the second direction, and a second width along a minor axis perpendicular to the major axis, and
wherein the second width is less than the first width, and each pair of second pixels from among the second pixels are on opposite sides of the major axis of an adjacent one of the first pixels.

47. The pixel arrangement structure of claim 1, wherein each pair of sides of the first pixels that are facing adjacent ones of the second pixels is longer than each pair of sides of the first pixels that are facing adjacent ones of the third pixels.

48. A pixel arrangement structure comprising a plurality of individually addressable pixels for displaying an image on a display,
  the plurality of individually addressable pixels being minimum addressable units of the display and comprising:
  a plurality of first pixels;
  a plurality of second pixels spaced from and alternately arranged with the first pixels in a first set of pixels aligned along a first direction from among the plurality of individually addressable pixels; and
  a plurality of third pixels spaced from the first pixels and the second pixels, the third pixels being alternately arranged with the first pixels in a second set of pixels aligned along a second direction crossing the first direction from among the plurality of individually addressable pixels, the first set of pixels and the second set of pixels intersecting at one of the first pixels,
  wherein the first pixels and the third pixels are alternately arranged in each of a third set of pixels aligned along the first direction and a fourth set of pixels aligned along the first direction, the third set of pixels and the fourth set of pixels being located at respective sides of the first set of pixels,
  wherein a shortest distance between two immediately adjacent ones of the first pixels is greater than a shortest distance between one of the second pixels and one of the third pixels that is adjacent to the one of the second pixels,
  wherein each of the first pixels has a convex shape such that a line bisecting the first pixel along a long axis thereof has a greater length than a line bisecting the first pixel along a shortest axis thereof, the long axis being perpendicular to the shortest axis,
  wherein each of the first pixels is located between two adjacent ones of the second pixels along a direction of the shortest axis,
  wherein each of the first pixels is located between two adjacent ones of the third pixels along a direction of the long axis,
  wherein at least one of the first pixels is symmetric about at least one of the long axis or the shortest axis, and
  wherein at least one of the first pixels is symmetric about at least one of the long axis or the shortest axis.

49. The pixel arrangement structure of claim 48, wherein centers of the first pixels and the third pixels in the third set of pixels are aligned along the first direction.

50. The pixel arrangement structure of claim 48, wherein the first pixels and the second pixels are alternately arranged in each of a fifth set of pixels aligned along the second direction and a sixth set of pixels aligned along the second direction, the fifth set of pixels and the sixth set of pixels being located at respective sides of the second set of pixels.

51. The pixel arrangement structure of claim 50, wherein centers of the first pixels and the second pixels in the fifth set of pixels are aligned along the second direction.

52. The pixel arrangement structure of claim 48,
  wherein a shortest distance between two adjacent ones of the first pixels is greater than a shortest distance between one of the second pixels and one of the third pixels that is adjacent to the one of the second pixels, and
  wherein the shortest distance between the two immediately adjacent ones of the first pixels is different from a shortest distance between two adjacent ones of the second pixels.

53. The pixel arrangement structure of claim 48, wherein a first pixel of the first pixels is symmetric with respect to at least one of an axis extending in the first direction or an axis extending in the second direction.

54. The pixel arrangement structure of claim 48, wherein some of the first pixels are arranged along a third direction crossing the first and second directions, and
  wherein adjacent ones of the some of the first pixels are mirror symmetric with respect to an axis extending in a fourth direction perpendicular to the third direction.

55. A pixel arrangement structure comprising a plurality of individually addressable pixels for displaying an image on a display,
  the plurality of individually addressable pixels being minimum addressable units of the display and comprising:
  a plurality of first pixels;
  a plurality of second pixels spaced from and alternately arranged with the first pixels in a first set of pixels aligned along a first direction from among the plurality of individually addressable pixels; and
  a plurality of third pixels spaced from the first pixels and the second pixels, the third pixels being alternately arranged with the first pixels in a second set of pixels aligned along a second direction crossing the first direction from among the plurality of individually addressable pixels, the first set of pixels and the second set of pixels intersecting at one of the first pixels,
  wherein the first pixels are configured to produce different color light from the second pixels and the third pixels,
  wherein the first pixels are different in size from at least one of the second pixels or the third pixels,
  wherein one of the first pixels comprises a first end portion, a center portion, and a second end portion that are sequentially arranged from a first end to a second end of the one of the first pixels, and wherein a width of each of the first and second end portions gradually decreases from the center portion towards the respective first and second ends of the one of the first pixels, and
  wherein a first pixel of the first pixels is symmetric with respect to at least one of an axis extending in the first direction or an axis extending in the second direction.

56. The pixel arrangement structure of claim 55, wherein the first pixels are configured to produce green light,
  wherein the second pixels are configured to produce blue light, and
  wherein the third pixels are configured to produce red light.

57. The pixel arrangement structure of claim 55, wherein the first pixels are smaller in size than the second pixels and the third pixels.

58. The pixel arrangement structure of claim 55, wherein the second pixels are different in size from the third pixels.

59. The pixel arrangement structure of claim 55, wherein a shortest distance between two adjacent ones of the first pixels is greater than a shortest distance between one of the second pixels and one of the third pixels that is adjacent to the one of the second pixels, and wherein the shortest distance between the two adjacent ones of the first pixels is different from a shortest distance between two adjacent ones of the second pixels.

60. The pixel arrangement structure of claim 55, wherein each of the first pixels has a convex shape such that a line bisecting the first pixel along a long axis thereof has a greater length than a line bisecting the first pixel along a shortest axis thereof, the long axis being perpendicular to the shortest axis,
wherein each of the first pixels is located between two adjacent ones of the second pixels along a direction of the shortest axis, and
wherein each of the first pixels is located between two adjacent ones of the third pixels along a direction of the long axis.

61. The pixel arrangement structure of claim 55, wherein some of the first pixels are arranged along a third direction crossing the first and second directions, and
wherein adjacent ones of the some of the first pixels are mirror symmetric with respect to an axis extending in a fourth direction perpendicular to the third direction.

62. A pixel arrangement structure comprising a plurality of individually addressable pixels for displaying an image on a light emitting display,
the plurality of individually addressable pixels being minimum addressable units of the display and comprising:
a plurality of first pixels;
a plurality of second pixels spaced from and alternately arranged with the first pixels in a first set of pixels aligned along a first direction from among the plurality of individually addressable pixels; and
a plurality of third pixels spaced from the first pixels and the second pixels, the third pixels being alternately arranged with the first pixels in a second set of pixels aligned along a second direction crossing the first direction from among the plurality of individually addressable pixels, the first set of pixels and the second set of pixels intersecting at one of the first pixels,
wherein a shortest distance between two immediately adjacent ones of the first pixels is greater than a shortest distance between one of the second pixels and one of the third pixels that is adjacent to the one of the second pixels,
wherein the shortest distance between the two immediately adjacent ones of the first pixels is different from a shortest distance between two adjacent ones of the second pixels,
wherein each of the first pixels, the second pixels, and the third pixels comprises a corresponding first electrode, and a shape of each of the pixels is defined, at least in part, by a pixel defining layer, and
wherein a first pixel of the first pixels is symmetric with respect to at least one of an axis extending in the first direction or an axis extending in the second direction.

63. The pixel arrangement structure of claim 62, wherein each of the first pixels, the second pixels, and the third pixels further comprises a corresponding light emitting layer on the corresponding first electrode.

64. The pixel arrangement structure of claim 63, wherein the corresponding light emitting layers of the first pixels are configured to emit light having a different color from the corresponding light emitting layers of the second pixels and the corresponding light emitting layers of the third pixels.

65. The pixel arrangement structure of claim 62, wherein each of the first pixels has a convex shape such that a line bisecting the first pixel along a long axis thereof has a greater length than a line bisecting the first pixel along a shortest axis thereof, the long axis being perpendicular to the shortest axis,
wherein each of the first pixels is located between two adjacent ones of the second pixels along a direction of the shortest axis, and
wherein each of the first pixels is located between two adjacent ones of the third pixels along a direction of the long axis.

66. The pixel arrangement structure of claim 62, wherein some of the first pixels are arranged along a third direction crossing the first and second directions, and
wherein adjacent ones of the some of the first pixels are mirror symmetric with respect to an axis extending in a fourth direction perpendicular to the third direction.

67. A pixel arrangement structure of a display, comprising a plurality of individually addressable pixels for displaying an image, the plurality of individually addressable pixels being minimum addressable units of the display and comprising:
a first pixel and a fourth pixel to produce light of a first color;
a second pixel and a fifth pixel to produce light of a second color different from the first color; and
a third pixel and a sixth pixel to produce light of a third color different from the first color and the second color,
wherein the first pixel, the second pixel, the third pixel, the fourth pixel, the fifth pixel, and the sixth pixel are spaced apart from one another,
wherein the second pixel, the third pixel, the fifth pixel, and the sixth pixel form a virtual square, the second pixel and the fifth pixel are at first diagonally opposite vertexes of the virtual square, and the third pixel and the sixth pixel are at second diagonally opposite vertexes of the virtual square,
wherein the first pixel is located in the virtual square,
wherein a shortest distance between the first pixel and the second pixel is a first length that is the same as a shortest distance between the first pixel and the third pixel, and
wherein the first pixel is entirely offset from every virtual line that touches a perimeter of the third pixel, and that extends in a first direction parallel to a first side of the virtual square or in a second direction perpendicular to the first direction.

68. The pixel arrangement structure of claim 67, wherein the first pixel and the fourth pixel have a first shape, the second pixel and the fifth pixel have a second shape different from the first shape, and the third pixel and the sixth pixel have a third shape different from the first shape and the second shape.

69. The pixel arrangement structure of claim 67, wherein the first pixel and the fourth pixel have a first size, the second pixel and the fifth pixel have a second size different from the first size, and the third pixel and the sixth pixel have a third size different from the first size and the second size.

70. The pixel arrangement structure of claim 67,
wherein the fourth pixel is adjacent to the first pixel, and
wherein the shortest distance between the first pixel and the fourth pixel is a second length that is greater than the first length.

71. The pixel arrangement structure of claim 70, wherein a shortest distance between the fourth pixel and the second pixel is the first length.

72. The pixel arrangement structure of claim 71, wherein each of the second pixel, the fifth pixel, the third pixel, and the sixth pixel is larger in size than each of the first pixel and the fourth pixel.

73. A display comprising:
a plurality of first pixel rows, each of the first pixel rows comprising a plurality of first pixels arranged along a first direction; and
a plurality of second pixel rows alternately arranged with the first pixel rows along a second direction crossing the first direction, each of the second pixel rows comprising a plurality of second pixels and a plurality of third pixels that are alternately arranged along the first direction,
wherein the pluralities of first pixels, the pluralities of second pixels, and the pluralities of third pixels are spaced apart from one another and are individually addressable pixels for displaying an image, the individually addressable pixels being minimum addressable units of the display,
wherein centers of the first pixels in a same one of the first pixel rows are aligned along the first direction,
wherein centers of the second pixels and the third pixels in a same one of the second pixel rows are aligned along the first direction,
wherein a distance in the first direction between the center of one of the second pixels and the center of one of the third pixels adjacent to the one of the second pixels in the same one of the second pixel rows is a first length that is the same as a shortest distance in the second direction between the center of one of the second pixels and the center of one of the third pixels in two different second pixel rows,
wherein each of the second pixels is larger in size than the first pixels, and
wherein one of the first pixels is entirely offset from every virtual line that touches a perimeter of one of the third pixels immediately adjacent to the one of the first pixels, and that extends in the first direction or in the second direction.

74. The display of claim 73, wherein the first pixels have a different shape from the second pixels, and the third pixels have a different shape from the first pixels and the second pixels, wherein a first side of the one of the first pixels is generally parallel to a side of an adjacent one of the second pixels that faces the first side, and wherein a second side of the one of the first pixels is generally parallel to a side of an adjacent one of the third pixels that faces the second side.

75. The display of claim 73, wherein the second pixels are larger in size than the third pixels.

76. The display of claim 75, wherein two adjacent ones of the first pixels have a symmetrical relationship with respect to a midpoint between the two adjacent ones of the first pixels.

77. The display of claim 75, wherein a shortest distance between the one of the first pixels and one of the second pixels that is adjacent to the one of the first pixels is a second length that is the same as a shortest distance between the one of the first pixels and the one of the third pixels that is adjacent to the one of the first pixels.

78. The display of claim 77, wherein a shortest distance between two adjacent ones of the first pixels is a third length that is greater than the second length.

79. The display of claim 75, wherein the center of the one of the first pixels is aligned with the centers of two of the second pixels that are adjacent to the one of the first pixels.

80. The display of claim 73, wherein the third pixels are larger in size than the first pixels.

81. A display comprising:
a plurality of first pixel rows, each of the first pixel rows comprising a plurality of first pixels arranged along a first direction;
a plurality of second pixel rows alternately arranged with the plurality of first pixel rows along a second direction crossing the first direction, each of the second pixel rows comprising a plurality of second pixels and a plurality of third pixels that are alternately arranged along the first direction;
a plurality of first pixel groups, each of the first pixel groups comprising a first one of the first pixels and one of the second pixels neighboring the first one of the first pixels; and
a plurality of second pixel groups, each of the second pixel groups comprising a second one of the first pixels and one of the third pixels neighboring the second one of the first pixels,
wherein the pluralities of first pixels, the pluralities of second pixels, and the pluralities of third pixels are spaced apart from one another and are individually addressable pixels for displaying an image, the individually addressable pixels being minimum addressable units of the display,
wherein the first pixel groups and the second pixel groups are alternately arranged along the first direction, and
wherein one of the first pixels is entirely offset from every virtual line that touches a perimeter of one of the third pixels immediately adjacent to the one of the first pixels, and that extends in the first direction or in the second direction.

82. The display of claim 81, wherein the first pixel groups and the second pixel groups are alternately arranged along the second direction.

83. The display of claim 81, wherein the first pixels are arranged on a plurality of first pixel columns extending in the second direction,
wherein the second pixels and the third pixels are alternately arranged on a plurality of second pixel columns extending in the second direction, and
wherein the first pixel columns and the second pixel columns are alternately arranged along the first direction.

84. The display of claim 81, wherein the first pixel groups are arranged in a plurality of first pixel sets along a first diagonal direction crossing the first direction and the second direction, and the second pixel groups are arranged in a plurality of second pixel sets along the first diagonal direction, and
wherein the first pixel sets and the second pixel sets are alternately arranged along a second diagonal direction crossing the first diagonal direction.

85. The display of claim 84, wherein the first pixels and the second pixels in the first pixel sets are alternately arranged along the first diagonal direction.

86. The display of claim 84, wherein the first pixels and the third pixels in the second pixel sets are alternately arranged along the first diagonal direction.

87. The display of claim 84, wherein the first pixel groups are arranged in a plurality of third pixel sets along the second diagonal direction, and the second pixel groups are arranged in a plurality of fourth pixel sets along the second diagonal direction, and
wherein the third pixel sets and the fourth pixel sets are alternately arranged along the first diagonal direction.

88. The display of claim 87, wherein the first pixels in the first pixel groups are elongated in the second diagonal direction, and
wherein the first pixels in the second pixel groups are elongated in the first diagonal direction.

89. The display of claim 81, wherein a virtual quadrangle formed by centers of two adjacent ones of the first pixels and centers of one of the second pixels and one of the third pixels that are adjacent to the two adjacent ones of the first pixels has a rhombus shape.

90. The display of claim 81, wherein a shortest distance between the pixels in the first pixel groups is the same as a shortest distance between the pixels in the second pixel groups.

91. A display comprising:
a plurality of first pixel rows, each of the first pixel rows comprising a plurality of first pixels arranged along a first direction; and
a plurality of second pixel rows alternately arranged with the plurality of first pixel rows along a second direction crossing the first direction, each of the second pixel rows comprising a plurality of second pixels and a plurality of third pixels that are alternately arranged along the first direction,
wherein the pluralities of first pixels, the pluralities of second pixels, and the pluralities of third pixels are spaced apart from one another and are individually addressable pixels for displaying an image, the individually addressable pixels being minimum addressable units of the display,
wherein first pixels from among the plurality of first pixels are aligned with each other along the second direction,
wherein all of the second pixels and the third pixels are offset in their entireties in the first direction from the first pixels aligned with each other along the second direction, and
wherein one of the first pixels is entirely offset from every virtual line that touches a perimeter of one of the third pixels immediately adjacent to the one of the first pixels, and that extends in the first direction or in the second direction.

92. The display of claim 91, wherein second pixels from among the plurality of second pixels are aligned with each other along the second direction and third pixels from among the plurality of third pixels are aligned with each other along the second direction, and
wherein all of the first pixels are offset in their entireties in the first direction from the second pixels aligned with each other along the second direction and the third pixels aligned with each other along the second direction.

93. The display of claim 91, wherein the first pixels are offset in their entireties in the second direction from all of the second pixels and all of the third pixels.

94. The display of claim 91, wherein the second pixels and the third pixels are offset in their entireties in the second direction from all of the first pixels.

95. The display of claim 91, wherein centers of two adjacent ones of the first pixels and centers of one of the second pixels and one of the third pixels that are equidistant to the centers of the two adjacent ones of the first pixels form a virtual quadrangle.

96. The display of claim 95, wherein the virtual quadrangle has a rhombus shape.

97. The display of claim 95, wherein two diagonals of the virtual quadrangle are parallel to the first direction and the second direction, respectively.

98. The display of claim 95, wherein the two adjacent ones of the first pixels are elongated in different directions.

99. The display of claim 95, wherein none of the pixels other than the pixels that form the virtual quadrangle are located in an area within the virtual quadrangle.

100. The display of claim 95, wherein a shortest distance between one of the two adjacent ones of the first pixels and the one of the second pixels on the virtual quadrangle is the same as a shortest distance between the one of the two adjacent ones of the first pixels and the one of the third pixels on the virtual quadrangle.

101. A method for displaying images on a display, the method comprising:
driving a first one or more of a plurality of pixels in a pixel arrangement structure to emit light; and
driving a second one or more of the plurality of pixels in the pixel arrangement structure to emit light,
wherein the pixel arrangement structure comprises:
a plurality of first pixels;
a plurality of second pixels spaced from the first pixels, the second pixels being alternately arranged with the first pixels along a first direction; and
a plurality of third pixels spaced from the first pixels and the second pixels, the third pixels being alternately arranged with the first pixels along a second direction crossing the first direction,
wherein the plurality of first pixels, the plurality of second pixels, and the plurality of third pixels are individually addressable pixels, the individually addressable pixels being minimum addressable units of the display,
wherein a shortest distance between two immediately adjacent ones of the first pixels is greater than a shortest distance between any of the plurality of second pixels and any of the plurality of third pixels that are nearest to each other,
wherein the shortest distance between the two immediately adjacent ones of the first pixels is different from a shortest distance between any two of the plurality of second pixels,
wherein each of the first pixels has a convex shape such that a line bisecting the first pixel along a long axis thereof has a greater length than a line bisecting the first pixel along a shortest axis thereof, the long axis being perpendicular to the shortest axis,
wherein each of the first pixels is located between two adjacent ones of the second pixels along a direction of the shortest axis,
wherein each of the first pixels is located between two adjacent ones of the third pixels along a direction of the long axis, and
wherein at least one of the first pixels is symmetric about at least one of the long axis or the shortest axis.

102. The method of claim 101, wherein at least two of the first pixels are aligned only with the second pixels in a first set of pixels arranged along the first direction from among the plurality of pixels.

103. The method of claim 101, wherein at least two of the first pixels are aligned only with the third pixels in a second set of pixels arranged along the second direction from among the plurality of pixels.

104. The method of claim 101, wherein a first first pixel and a second first pixel from among the plurality of first pixels are aligned along the first direction with a second pixel from among the plurality of second pixels interposed therebetween, and have a symmetrical relationship with respect to a center of the second pixel.

105. The method of claim 101, wherein a first first pixel and a second first pixel from among the plurality of first pixels are aligned along the second direction with a third pixel from among the plurality of third pixels interposed therebetween, and have a symmetrical relationship with respect to a center of the third pixel.

106. The method of claim 101, wherein the shortest distance between the two immediately adjacent ones of the first pixels is greater than a length of each side of the two immediately adjacent ones of the first pixels.

107. The method of claim 101, wherein a first second pixel of the plurality of second pixels, a first third pixel of the plurality of third pixels, a second second pixel of the plurality of second pixels, and a second third pixel of the plurality of third pixels are respectively located at four vertexes of a virtual square, and wherein a first pixel of the plurality of first pixels is located at a center of the virtual square.

108. The method of claim 107, wherein the second pixels and the third pixels are alternately arranged in a first set of pixels that are aligned along a third direction that is parallel to a side of the virtual square from among the plurality of pixels.

109. The method of claim 108, wherein centers of the second pixels and the third pixels in the first set of pixels are aligned along the third direction.

110. The method of claim 108, wherein only the first pixels are arranged in a second set of pixels that are aligned along the third direction from among the plurality of pixels.

111. The method of claim 110, wherein centers of the first pixels in the second set of pixels are aligned along the third direction.

112. The method of claim 110, wherein the first set of pixels and the second set of pixels are adjacent to one another.

113. The method of claim 110, wherein two adjacent ones of the first pixels in the second set of pixels have a symmetrical relationship with respect to a midpoint between the two adjacent ones of the first pixels in the second set of pixels.

114. The method of claim 113, wherein the two adjacent ones of the first pixels in the second set of pixels are elongated in the first direction and the second direction, respectively.

115. The method of claim 110, wherein a row or a column formed by the first pixels in the second set of pixels has a width region corresponding to a direction perpendicular to the side of the virtual square, and wherein the width region does not overlap with at least one of the second pixels or the third pixels.

116. The method of claim 115, wherein the width region does not overlap with any of the second pixels and the third pixels.

117. The method of claim 110, wherein a shortest distance between two adjacent ones of the second pixels in the first set of pixels is greater than a shortest distance between two adjacent ones of the first pixels in the second set of pixels.

118. The method of claim 110, wherein a shortest distance between one of the second pixels in the first set of pixels and one of the third pixels in the first set of pixels that is adjacent to the one of the second pixels is shorter than a shortest distance between two adjacent ones of the first pixels in the second set of pixels.

119. The method of claim 118, wherein the two adjacent ones of the first pixels in the second set of pixels have a symmetrical relationship with respect to a midpoint between the two adjacent ones of the first pixels in the second set of pixels.

120. The method of claim 101, wherein a shortest distance between a first first pixel of the plurality of first pixels and a second pixel that is adjacent to the first first pixel in the first direction from among the plurality of second pixels is the same as a shortest distance between a second first pixel of the plurality of first pixels and a third pixel that is adjacent to the second first pixel in the second direction from among the plurality of third pixels.

121. The method of claim 101, wherein each of the first pixels, the second pixels, and the third pixels has a shape having a plurality of outwardly convex portions.

122. The method of claim 121, wherein each of the first pixels, the second pixels, and the third pixels has at least four sides, and wherein two adjacent ones of the at least four sides form each of the outwardly convex portions.

123. The method of claim 101, wherein two adjacent ones of the first pixels along a third direction have different inclination directions from each other.

124. The method of claim 123, wherein no pixel is located between the two adjacent ones of the first pixels along the third direction.

125. The method of claim 123, wherein at least one of the first pixels has a generally octagonal shape.

126. The method of claim 101, wherein the second pixels have a different shape from the third pixels.

127. The method of claim 101, wherein the second pixels have a different size from the third pixels.

128. The method of claim 101, wherein the first pixels and the second pixels that are aligned with the first pixels along the first direction in a set of pixels from among the plurality of pixels have a width region corresponding to a largest width of the first pixels and the second pixels in a direction perpendicular to the first direction, and wherein the width region does not overlap with the first pixels, the second pixels, and the third pixels that are not in the set of pixels.

129. The method of claim 101, wherein the first pixels and the third pixels that are aligned with the first pixels along the second direction in a set of pixels from among the plurality of pixels have a width region corresponding to a largest width of the first pixels and the third pixels in a direction perpendicular to the second direction, and wherein the width region does not overlap with the first pixels, the second pixels, and the third pixels that are not in the set of pixels.

130. The method of claim 101, wherein centers of the first pixels are aligned with centers of the second pixels along the first direction.

131. The method of claim 101, wherein centers of the first pixels are aligned with centers of the third pixels along the second direction.

132. The method of claim 101, wherein the first pixels, the second pixels, and the third pixels are configured to emit different color lights, and wherein light emitting layers of the first pixels, the second pixels, and the third pixels are respectively formed by utilizing different fine metal masks.

133. The method of claim 101, wherein one of the first pixels is entirely offset from every virtual line that touches a perimeter of one of the third pixels immediately adjacent to the one of the first pixels, and that extends in a third direction or in a fourth direction, wherein the third direction crosses the first direction and the second direction, and the fourth direction is perpendicular to the third direction.

134. A method for displaying images on a display, the method comprising:
 driving a first one or more of a plurality of pixels in a pixel arrangement structure to emit light; and
 driving a second one or more of the plurality of pixels in the pixel arrangement structure to emit light,
 wherein the pixel arrangement structure comprises:
  a plurality of first pixels;
  a plurality of second pixels spaced from and alternately arranged with the first pixels in a first set of pixels aligned along a first direction from among the plurality of pixels; and
  a plurality of third pixels spaced from the first pixels and the second pixels, the third pixels being alternately arranged with the first pixels in a second set of pixels aligned along a second direction crossing the first direction from among the plurality of pixels, the first set of pixels and the second set of pixels intersecting at one of the first pixels,
 wherein the plurality of first pixels, the plurality of second pixels, and the plurality of third pixels are individually addressable pixels, the individually addressable pixels being minimum addressable units of the display,
 wherein the first pixels and the third pixels are alternately arranged in each of a third set of pixels aligned along the first direction and a fourth set of pixels aligned along the first direction, the third set of pixels and the fourth set of pixels being located at respective sides of the first set of pixels,
 wherein a shortest distance between two immediately adjacent ones of the first pixels is greater than a shortest distance between one of the second pixels and one of the third pixels that is adjacent to the one of the second pixels,
 wherein each of the first pixels has a convex shape such that a line bisecting the first pixel along a long axis thereof has a greater length than a line bisecting the first pixel along a shortest axis thereof, the long axis being perpendicular to the shortest axis,
 wherein each of the first pixels is located between two adjacent ones of the second pixels along a direction of the shortest axis,
 wherein each of the first pixels is located between two adjacent ones of the third pixels along a direction of the long axis, and
 wherein at least one of the first pixels is symmetric about at least one of the long axis or the shortest axis.

135. The method of claim 134, wherein centers of the first pixels and the third pixels in the third set of pixels are aligned along the first direction.

136. The method of claim 134, wherein the first pixels and the second pixels are alternately arranged in each of a fifth set of pixels aligned along the second direction and a sixth set of pixels aligned along the second direction, the fifth set of pixels and the sixth set of pixels being located at respective sides of the second set of pixels.

137. The method of claim 136, wherein centers of the first pixels and the second pixels in the fifth set of pixels are aligned along the second direction.

138. The method of claim 134, wherein the shortest distance between the two immediately adjacent ones of the first pixels is different from a shortest distance between two adjacent ones of the second pixels.

139. A method for displaying images on a display, the method comprising:
 driving a first one or more of a plurality of pixels in a pixel arrangement structure to emit light; and
 driving a second one or more of the plurality of pixels in the pixel arrangement structure to emit light,
 wherein the pixel arrangement structure comprises:
  a plurality of first pixels;
  a plurality of second pixels spaced from and alternately arranged with the first pixels in a first set of pixels aligned along a first direction from among the plurality of pixels; and
  a plurality of third pixels spaced from the first pixels and the second pixels, the third pixels being alternately arranged with the first pixels in a second set of pixels aligned along a second direction crossing the first direction from among the plurality of pixels, the first set of pixels and the second set of pixels intersecting at one of the first pixels,
 wherein the plurality of first pixels, the plurality of second pixels, and the plurality of third pixels are individually addressable pixels, the individually addressable pixels being minimum addressable units of the display,
 wherein the first pixels are configured to produce different color light from the second pixels and the third pixels,
 wherein the first pixels are different in size from at least one of the second pixels or the third pixels,
 wherein one of the first pixels comprises a first end portion, a center portion, and a second end portion that are sequentially arranged from a first end to a second end of the one of the first pixels, and wherein a width of each of the first and second end portions gradually decreases from the center portion towards the respective first and second ends of the one of the first pixels,
 wherein a first pixel of the first pixels is symmetric with respect to at least one of an axis extending in the first direction or an axis extending in the second direction.

140. The method of claim 139, wherein the first pixels are configured to produce green light,
 wherein the second pixels are configured to produce blue light, and
 wherein the third pixels are configured to produce red light.

141. The method of claim 139, wherein the first pixels are smaller in size than the second pixels and the third pixels.

142. The method of claim 139, wherein the second pixels are different in size from the third pixels.

143. The method of claim 139, wherein a shortest distance between two adjacent ones of the first pixels is greater than a shortest distance between one of the second pixels and one of the third pixels that is adjacent to the one of the second pixels, and
 wherein the shortest distance between the two adjacent ones of the first pixels is different from a shortest distance between two adjacent ones of the second pixels.

144. A method for displaying images on a display, the method comprising:
 driving a first one or more of a plurality of pixels in a pixel arrangement structure to emit light; and
 driving a second one or more of the plurality of pixels in the pixel arrangement structure to emit light,
 wherein the pixel arrangement structure comprises:
  a plurality of first pixels;
  a plurality of second pixels spaced from and alternately arranged with the first pixels in a first set of pixels aligned along a first direction from among the plurality of pixels; and a plurality of third pixels spaced from the first pixels and the second pixels, the third pixels being alternately arranged with the first pixels in a second set of pixels aligned along a second direction crossing the first direction from among the plurality of pixels, the first set of pixels and the second set of pixels intersecting at one of the first pixels, wherein the plurality of first pixels, the plurality of second pixels, and the plurality of third pixels are individually addressable pixels, the individually addressable pixels being minimum addressable units of the display, wherein a shortest distance between two immediately adjacent ones of the first pixels is greater than a shortest distance between one of the second pixels and one of the third pixels that is adjacent to the one of the second pixels, wherein the shortest distance between the two immediately adjacent ones of the first pixels is different from a shortest distance between two adjacent ones of the second pixels, wherein each of the first pixels, the second pixels, and the third pixels comprises a corresponding first electrode, and a shape of each of the pixels is defined, at least in part, by a pixel defining layer, and wherein a first pixel of the first pixels is symmetric with respect to at least one of an axis extending in the first direction or an axis extending in the second direction.

145. The method of claim 144, wherein each of the first pixels, the second pixels, and the third pixels further comprises a corresponding light emitting layer on the corresponding first electrode.

146. The method of claim 145, wherein the corresponding light emitting layers of the first pixels are configured to emit light having a different color from the corresponding light emitting layers of the second pixels and the corresponding light emitting layers of the third pixels.

147. A method for displaying images on a display, the method comprising:
driving a first one or more of a plurality of pixels in a pixel arrangement structure to emit light; and
driving a second one or more of the plurality of pixels in the pixel arrangement structure to emit light,
wherein the pixel arrangement structure comprises:
a first pixel and a fourth pixel to produce light of a first color;
a second pixel and a fifth pixel to produce light of a second color different from the first color; and
a third pixel and a sixth pixel to produce light of a third color different from the first color and the second color,
wherein the first pixel, the second pixel, the third pixel, the fourth pixel, the fifth pixel, and the sixth pixel are spaced apart from one another and are individually addressable pixels, the individually addressable pixels being minimum addressable units of the display,
wherein the second pixel, the third pixel, the fifth pixel, and the sixth pixel form a virtual square, the second pixel and the fifth pixel are at first diagonally opposite vertexes of the virtual square, and the third pixel and the sixth pixel are at second diagonally opposite vertexes of the virtual square,
wherein the first pixel is located in the virtual square,
wherein a shortest distance between the first pixel and the second pixel is a first length that is the same as a shortest distance between the first pixel and the third pixel, and
wherein the first pixel is entirely offset from every virtual line that touches a perimeter of the third pixel, and that extends in a first direction parallel to a first side of the virtual square or in a second direction perpendicular to the first direction.

148. The method of claim 147, wherein the first pixel and the fourth pixel have a first shape, the second pixel and the fifth pixel have a second shape different from the first shape, and the third pixel and the sixth pixel have a third shape different from the first shape and the second shape.

149. The method of claim 147, wherein the first pixel and the fourth pixel have a first size, the second pixel and the fifth pixel have a second size different from the first size, and the third pixel and the sixth pixel have a third size different from the first size and the second size.

150. The method of claim 147, wherein the fourth pixel is adjacent to the first pixel, and
wherein the shortest distance between the first pixel and the fourth pixel is a second length that is greater than the first length.

151. The method of claim 150, wherein a shortest distance between the fourth pixel and the second pixel is the first length.

152. The method of claim 151, wherein each of the second pixel, the fifth pixel, the third pixel, and the sixth pixel is larger in size than each of the first pixel and the fourth pixel.

153. A method for displaying images on a display, the method comprising:
driving a first one or more of a plurality of pixels in a pixel arrangement structure to emit light; and
driving a second one or more of the plurality of pixels in the pixel arrangement structure to emit light,
wherein the pixel arrangement structure comprises:
a plurality of first pixel rows, each of the first pixel rows comprising a plurality of first pixels arranged along a first direction; and
a plurality of second pixel rows alternately arranged with the first pixel rows along a second direction crossing the first direction, each of the second pixel rows comprising a plurality of second pixels and a plurality of third pixels that are alternately arranged along the first direction,
wherein the pluralities of first pixels, the pluralities of second pixels, and the pluralities of third pixels are spaced apart from one another and are individually addressable pixels for displaying an image, the individually addressable pixels being minimum addressable units of the display,
wherein centers of the first pixels in a same one of the first pixel rows are aligned along the first direction,
wherein centers of the second pixels and the third pixels in a same one of the second pixel rows are aligned along the first direction,
wherein a distance in the first direction between the center of one of the second pixels and the center of one of the third pixels adjacent to the one of the second pixels in the same one of the second pixel rows is a first length that is the same as a shortest distance in the second direction between the center of one of the second pixels and the center of one of the third pixels in two different second pixel rows,
wherein each of the second pixels is larger in size than the first pixels, and
wherein one of the first pixels is entirely offset from every virtual line that touches a perimeter of one of the third pixels immediately adjacent to the one of the first pixels, and that extends in the first direction or in the second direction.

154. The method of claim 153, wherein the first pixels have a different shape from the second pixels, and the third pixels have a different shape from the first pixels and the second pixels, wherein a first side of the one of the first pixels is generally parallel to a side of an adjacent one of the second pixels that faces the first side, and wherein a second side of the one of the first pixels is generally parallel to a side of an adjacent one of the third pixels that faces the second side.

155. The method of claim 153, wherein the second pixels are larger in size than the third pixels.

156. The method of claim 155, wherein two adjacent ones of the first pixels have a symmetrical relationship with respect to a midpoint between the two adjacent ones of the first pixels.

157. The method of claim 155, wherein a shortest distance between the one of the first pixels and one of the second pixels that is adjacent to the one of the first pixels is a second length that is the same as a shortest distance between the one of the first pixels and the one of the third pixels that is adjacent to the one of the first pixels.

158. The method of claim 157, wherein a shortest distance between two adjacent ones of the first pixels is a third length that is greater than the second length.

159. The method of claim 155, wherein the center of the one of the first pixels is aligned with the centers of two of the second pixels that are adjacent to the one of the first pixels.

160. The method of claim 153, wherein the third pixels are larger in size than the first pixels.

161. A method for displaying images on a display, the method comprising:
 driving a first one or more of a plurality of pixels in a pixel arrangement structure to emit light; and
 driving a second one or more of the plurality of pixels in the pixel arrangement structure to emit light,
 wherein the pixel arrangement structure comprises:
 a plurality of first pixel rows, each of the first pixel rows comprising a plurality of first pixels arranged along a first direction;
 a plurality of second pixel rows alternately arranged with the plurality of first pixel rows along a second direction crossing the first direction, each of the second pixel rows comprising a plurality of second pixels and a plurality of third pixels that are alternately arranged along the first direction;
 a plurality of first pixel groups, each of the first pixel groups comprising a first one of the first pixels and one of the second pixels neighboring the first one of the first pixels; and
 a plurality of second pixel groups, each of the second pixel groups comprising a second one of the first pixels and one of the third pixels neighboring the second one of the first pixels,
 wherein the pluralities of first pixels, the pluralities of second pixels, and the pluralities of third pixels are spaced apart from one another and are individually addressable pixels for displaying an image, the individually addressable pixels being minimum addressable units of the display,
 wherein the first pixel groups and the second pixel groups are alternately arranged along the first direction, and
 wherein one of the first pixels is entirely offset from every virtual line that touches a perimeter of one of the third pixels immediately adjacent to the one of the first pixels, and that extends in the first direction or in the second direction.

162. The method of claim 161, wherein the first pixel groups and the second pixel groups are alternately arranged along the second direction.

163. The method of claim 161, wherein the first pixels are arranged on a plurality of first pixel columns extending in the second direction,
 wherein the second pixels and the third pixels are alternately arranged on a plurality of second pixel columns extending in the second direction, and
 wherein the first pixel columns and the second pixel columns are alternately arranged along the first direction.

164. The method of claim 161, wherein the first pixel groups are arranged in a plurality of first pixel sets along a first diagonal direction crossing the first direction and the second direction, and the second pixel groups are arranged in a plurality of second pixel sets along the first diagonal direction, and
 wherein the first pixel sets and the second pixel sets are alternately arranged along a second diagonal direction crossing the first diagonal direction.

165. The method of claim 164, wherein the first pixels and the second pixels in the first pixel sets are alternately arranged along the first diagonal direction.

166. The method of claim 164, wherein the first pixels and the third pixels in the second pixel sets are alternately arranged along the first diagonal direction.

167. The method of claim 164, wherein the first pixel groups are arranged in a plurality of third pixel sets along the second diagonal direction, and the second pixel groups are arranged in a plurality of fourth pixel sets along the second diagonal direction, and
 wherein the third pixel sets and the fourth pixel sets are alternately arranged along the first diagonal direction.

168. The method of claim 167, wherein the first pixels in the first pixel groups are elongated in the second diagonal direction, and
 wherein the first pixels in the second pixel groups are elongated in the first diagonal direction.

169. The method of claim 161, wherein a virtual quadrangle formed by centers of two adjacent ones of the first pixels and centers of one of the second pixels and one of the third pixels that are adjacent to the two adjacent ones of the first pixels has a rhombus shape.

170. The method of claim 161, wherein a shortest distance between the pixels in the first pixel groups is the same as a shortest distance between the pixels in the second pixel groups.

171. A method for displaying images on a display, the method comprising:
 driving a first one or more of a plurality of pixels in a pixel arrangement structure to emit light; and
 driving a second one or more of the plurality of pixels in the pixel arrangement structure to emit light,
 wherein the pixel arrangement structure comprises:
 a plurality of first pixel rows, each of the first pixel rows comprising a plurality of first pixels arranged along a first direction; and
 a plurality of second pixel rows alternately arranged with the plurality of first pixel rows along a second direction crossing the first direction, each of the second pixel rows comprising a plurality of second pixels and a plurality of third pixels that are alternately arranged along the first direction,
 wherein the pluralities of first pixels, the pluralities of second pixels, and the pluralities of third pixels are spaced apart from one another and are individually addressable pixels for displaying an image, the individually addressable pixels being minimum addressable units of the display, wherein first pixels from among the plurality of first pixels are aligned with each other along the second direction, wherein all of the second pixels and the third pixels are offset in their entireties in the first direction from the first pixels aligned with each other along the second direction, and wherein one of the first pixels is entirely offset from every virtual line that touches a perimeter of one of the third pixels immediately adjacent to the one of the first pixels, and that extends in the first direction or in the second direction.

172. The method of claim 171, wherein second pixels from among the plurality of second pixels are aligned with each other along the second direction and third pixels from among the plurality of third pixels are aligned with each other along the second direction, and wherein all of the first pixels are offset in their entireties in the first direction from the second pixels aligned with each other along the second direction and the third pixels aligned with each other along the second direction.

173. The method of claim 171, wherein the first pixels are offset in their entireties in the second direction from all of the second pixels and all of the third pixels.

174. The method of claim 171, wherein the second pixels and the third pixels are offset in their entireties in the second direction from all of the first pixels.

175. The method of claim 171, wherein centers of two adjacent ones of the first pixels and centers of one of the second pixels and one of the third pixels that are equidistant to the centers of the two adjacent ones of the first pixels form a virtual quadrangle.

176. The method of claim 175, wherein the virtual quadrangle has a rhombus shape.

177. The method of claim 175, wherein two diagonals of the virtual quadrangle are parallel to the first direction and the second direction, respectively.

178. The method of claim 175, wherein the two adjacent ones of the first pixels are elongated in different directions.

179. The method of claim 175, wherein none of the pixels other than the pixels that form the virtual quadrangle are located in an area within the virtual quadrangle.

180. The method of claim 175, wherein a shortest distance between one of the two adjacent ones of the first pixels and the one of the second pixels on the virtual quadrangle is the same as a shortest distance between the one of the two adjacent ones of the first pixels and the one of the third pixels on the virtual quadrangle.

* * * * *